(12) United States Patent
Kitamura

(10) Patent No.: US 10,536,154 B2
(45) Date of Patent: Jan. 14, 2020

(54) PLL CIRCUIT FOR RADAR

(71) Applicant: DENSO CORPORATION, Kariya, Aichi-pref. (JP)

(72) Inventor: Tomomitsu Kitamura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/504,801

(22) Filed: Jul. 8, 2019

(65) Prior Publication Data

US 2019/0334534 A1 Oct. 31, 2019

Related U.S. Application Data

(63) Continuation of application No. PCT/JP2017/041494, filed on Nov. 17, 2017.

(30) Foreign Application Priority Data

Feb. 8, 2017 (JP) .................................. 2017-021307

(51) Int. Cl.

| H03L 7/099 | (2006.01) |
|---|---|
| G01S 13/34 | (2006.01) |
| G01S 7/35 | (2006.01) |
| H03C 3/09 | (2006.01) |
| H04B 1/408 | (2015.01) |
| H03B 5/12 | (2006.01) |
| H03L 7/10 | (2006.01) |

(52) U.S. Cl.
CPC ................ *H03L 7/099* (2013.01); *G01S 7/35* (2013.01); *G01S 13/34* (2013.01); *H03B 5/124* (2013.01); *H03B 5/1228* (2013.01); *H03C 3/095* (2013.01); *H03L 7/10* (2013.01); *H04B 1/408* (2013.01)

(58) Field of Classification Search
USPC .................................. 327/147–149, 156–158
See application file for complete search history.

(56) References Cited

U.S. PATENT DOCUMENTS

| 7,856,212 | B2* | 12/2010 | Pellerano | ............... H03L 7/193 |
|---|---|---|---|---|
| | | | | 327/147 |
| 8,750,448 | B2* | 6/2014 | Mazkou | ............... H03L 7/081 |
| | | | | 327/156 |
| 2005/0168253 | A1* | 8/2005 | Hirayama | ............... H03L 7/087 |
| | | | | 327/156 |
| 2006/0055467 | A1 | 3/2006 | Ochi et al. | |
| 2006/0220757 | A1 | 10/2006 | Sataka et al. | |

(Continued)

*Primary Examiner* — Adam D Houston
(74) *Attorney, Agent, or Firm* — Posz Law Group, PLC

(57) ABSTRACT

In a PLL circuit, a multi-band control oscillator includes multiple bands gradually increasing or decreasing a frequency in accordance with a control signal and being separated from each other, is capable of selectively switching one band among the multiple bands, and generates a signal of a frequency corresponding to the control signal in the band that is switched as a reference signal. A band setting unit sets the band of the multi-band control oscillator. The band setting unit sets the band for a present or subsequent time after a control command generator finishes outputting the control command to gradually increase or decrease from a previous start frequency to a previous stop frequency and before the control command generator starts outputting the control command to gradually increase or decrease from a present start frequency.

16 Claims, 18 Drawing Sheets

(56) References Cited

U.S. PATENT DOCUMENTS

| | | | |
|---|---|---|---|
| 2010/0073051 A1* | 3/2010 | Rao | H03L 7/0898 327/157 |
| 2011/0254632 A1 | 10/2011 | Sawada | |
| 2011/0260760 A1* | 10/2011 | Wu | H03L 7/0898 327/148 |
| 2011/0260763 A1* | 10/2011 | Wang | H03L 7/087 327/157 |
| 2013/0141146 A1* | 6/2013 | Shima | H03L 7/099 327/157 |
| 2014/0120847 A1* | 5/2014 | Shima | G06F 1/08 455/73 |
| 2015/0280723 A1* | 10/2015 | Fan | H03L 7/085 327/156 |
| 2016/0182065 A1* | 6/2016 | Wicpalek | H03L 7/099 327/156 |
| 2017/0023670 A1 | 1/2017 | Jansen | |

* cited by examiner

PLL CIRCUIT FOR RADAR

CROSS REFERENCE TO RELATED APPLICATIONS

The present application is a continuation application of International Patent Application No. PCT/JP2017/041494 filed on Nov. 17, 2017, which designated the U.S. and claims the benefit of priority from Japanese Patent Application No. 2017-21307 filed on Feb. 8, 2017. The entire disclosures of all of the above applications are incorporated herein by reference.

TECHNICAL FIELD

The present disclosure relates to a phase locked loop (PLL) circuit for radar.

BACKGROUND

In recent years, a number of technologies such as collision prevention and self-driving have been proposed, and attention has been paid to a technique for measuring a distance from a host device to a target with the use of a radar technique. For example, the present applicants have proposed a millimeter wave band radar device for a vehicle as a device for measuring the distance from the host device to a target Various electronic components are incorporated in the radar device, and a PLL circuit using a voltage control oscillator is used in the electronic components.

SUMMARY

The present disclosure provides a PLL circuit that includes a multi-band control oscillator and a band setting unit. The multi-band control oscillator includes multiple bands gradually increasing or decreasing a frequency in accordance with a control signal and being separated from each other, is capable of selectively switching one band among the multiple bands, and generates a signal of a frequency corresponding to the control signal in the band that is switched as a reference signal. The band setting unit sets the band of the multi-band control oscillator. The band setting unit sets the band for a present or subsequent time after a control command generator finishes outputting a control command to gradually increase or decrease from a previous start frequency to a previous stop frequency and before the control command generator starts outputting the control command to gradually increase or decrease from a present start frequency.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
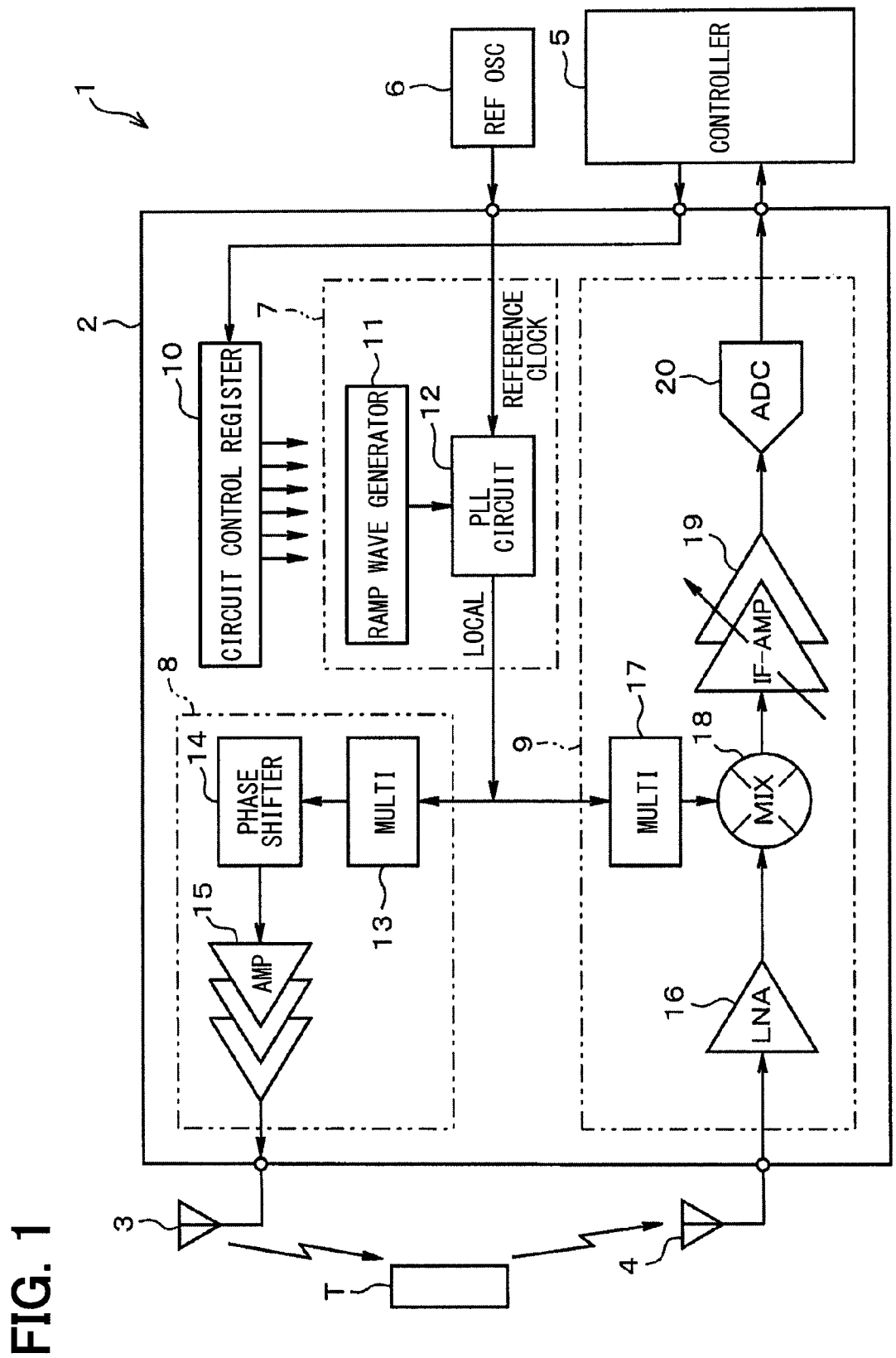
FIG. 1 is an electrical configuration diagram schematically showing an overall system according to a first embodiment.

A PLL circuit for radar may be designed in consideration of a first range for satisfying a standard frequency band of the radar, a second range for calibrating variations due to changes in a manufacturing process, a power supply voltage, and a temperature (so-called PVT), and a third range indicating a modulation frequency band. A voltage control oscillator having a multi-band configuration can be used for adjusting those ranges.

Some in-vehicle radar devices employ a system in which the frequency of a modulated signal is gradually increased or decreased with the use of various modulation systems such as a so-called frequency modulated continuous wave (FMCW) modulation system, a sawtooth modulation system, or a chirped wave modulation system, the generated signal is output as a radar transmission wave to a target object, and information on the target object is acquired based on a signal received from the target object. When a multi-band voltage control oscillator is applied to the radar device, the change amount of the variable capacitance can be used as the gradually increase or gradually decrease amount of the modulation frequency while selecting the band by switching a fixed capacitance.

However, in a case of using a limited modulation system as described above, for example, and in a case where the vehicle-mounted radar device of the host vehicle uses a specific modulation system similar to that of the vehicle-mounted radar device mounted on another vehicle, an erroneous recognition and an erroneous determination may occur due to mutual interference.

For that reason, the present inventors consider that the frequency variable width is expanded as much as possible from the frequency width to gradually increase or decrease in the modulation system described above, and a unique frequency change pattern such as a step change or a frequency spread of the frequency is adopted while the frequency is gradually increased or decreased, so that an interference with other devices is prevented as much as possible.

Further, in the radar device, since a rate of the modulation frequency width to the standard frequency band is larger than that of the standard of, for example, the cellular phone, the advantages of the multi-band configuration are hardly obtained. In other words, in the radar device, although a change in the variable capacitance of the multi-band configuration can be used as a change in the modulation frequency, it is practically difficult to further expand the frequency variable width by the variable capacitance for the purpose of realizing a unique frequency change pattern.

According to an aspect of the present disclosure, a PLL circuit for radar is configured to generate a reference signal and configured to be used in a radar system including a transmitter, a receiver, and a control command generator. The transmitter generates a radar transmission wave in response to the reference signal and transmitting the radar transmission wave to a target object. The receiver receives a reflected signal reflected from the target object in response to the reference signal. The control command generator generates and outputs a control command to the PLL circuit. The PLL circuit includes a multi-band control oscillator and a band setting unit. The multi-band control oscillator has a plurality of bands that gradually increases or decreases a frequency in response to a control signal and is separated from each other. The multi-band control oscillator is configured to be capable of selectively switching one band among the plurality of bands, and is configured to generate a signal of a frequency corresponding to the control signal in the band that is switched as the reference signal. The band setting unit is configured to set the band of the multi-band control oscillator. The band setting unit is configured to set the band to be used for a present or subsequent time after the control command generator finishes outputting the control command to gradually increase or decrease the frequency from a previous start frequency to a previous stop frequency and before the control command generator starts outputting the control command to gradually increase or decrease the frequency from a present start frequency.

The band setting unit sets the band to be switched and the multi-band control oscillator can generate a signal of the frequency corresponding to the control signal in the band that is switched as the reference signal. As a result, the frequency variable width can be further expanded more than the frequency width which can be gradually increased or decreased, and a unique frequency change pattern can be easily adopted.

Several embodiments of PLL circuit for radar will be described below with respect to the drawings. In each of the embodiments described below, the same or similar reference numerals are assigned to the same or similar components that perform the same or similar operations, and a description of the same or similar components will be omitted as necessary. In the following embodiments, the same or similar components are denoted by the same reference numerals in the tenth order and the first order. Hereinafter, a configuration applied to a millimeter wave radar system will be described.

First Embodiment

FIGS. 1 to 11 show illustrative diagrams according to a first embodiment. FIG. 1 schematically shows a configuration of an entire system. A millimeter wave radar system 1 includes a one-chip transceiver mounted IC 2, a transmission antenna 3, a reception antenna 4, a controller 5, and a reference oscillation circuit (REF OSC) 6. The transceiver mounted IC 2 and the controller 5 may be configured as one chip or may be configured as separate chips. The controller 5 and the reference oscillation circuit 6 formed of a crystal oscillator are connected to the transceiver mounted IC 2. The reference oscillation circuit 6 generates a reference clock of a certain reference frequency, and outputs the reference clock to a modulated-demodulated signal generator 7 in the transceiver mounted IC 2.

The transceiver mounted IC 2 includes a modulated-demodulated signal generator 7, a transmitter 8, a receiver 9, and a circuit control register 10. The controller 5 performs command processing and circuit control processing to the transceiver mounted IC 2 in response to writing, in the circuit control register 10, a frequency command such as a start frequency fsta and parameters such as the amplification degree of an intermediate frequency amplifier 19. The transceiver mounted IC 2 is configured by a semiconductor integrated circuit device.

The modulated-demodulated signal generator 7 includes a ramp wave generator 11 as a control command generator and a PLL circuit 12. The ramp wave generator 11 generates, for example, a command signal (start frequency fsta→stop frequency fsto) and various control commands (ramp control signal Ramp # on) for gradually increasing and decreasing the frequency in a temporal manner in response to a frequency command input to the circuit control register 10 and outputs the generated signals to the PLL circuit 12.

Although the ramp wave generator 11 is exemplified in this example as generating a sawtooth wave, blocks for generating and outputting signals gradually increasing and decreasing in time, such as a chirp wave and an FMCW wave, may be used according to a modulation system to be employed, and the modulation system is not limited as long as the signal gradually increasing and decreasing in time is generated as a modulated signal.

Upon receiving the reference clock of the reference oscillation circuit 6, the modulated-demodulated signal generator 7 generates a signal gradually increasing or decreasing the frequency within a predetermined standard frequency band by a sawtooth modulation system (predetermined modulation system), and outputs the generated signal as a high-precision local signal (LOCAL). A frequency of the local signal is adjusted to an Fmod/N frequency (N is a multiplication number by N-multipliers (MULTI) 13 and 17 to be described later), and the adjusted local signal is output to the transmitter 8 and the receiver 9. In this example, the modulated-demodulated signal generator 7 generates a local signal having a frequency Fmod/N by gradually increasing or decreasing by a predetermined modulation system, but a local signal having a frequency Fmod may be generated, and the signal form is not limited. The local signal corresponds to a reference signal.

The transmitter 8 includes the N-multiplier 13 for multiplying the local signal by N, a phase shifter 14 for shifting the phase of the signal output from the N-multiplier 13, and an amplifier (AMP) 15 for amplifying the output of the phase shifter 14, and outputs an amplified signal of the amplifier 15. Since the N-multiplier 13 multiplies the output of the modulated-demodulated signal generator 7 by N, the frequency of the output signal of the N-multiplier 13 becomes a modulation frequency Fmod, and the signal is phase-shifted by the phase shifter 14 and amplified by the amplifier 15. Therefore, the frequency of the transmission signals of the transmitter 8 becomes a modulation frequency Fmod.

The transmission signal of the transmitter 8 is output as a radar transmission wave to the outside through the transmission antenna 3. The phase shifter 14 is provided to change the phase of the signal output from the N-multiplier 13. As shown schematically in FIG. 1, the transmission antenna 3 includes multiple antenna elements such as planar antennas formed by a patch antenna, for example. The phase shifter 14 is connected, for example, to each of a plurality of antenna elements constituting the transmission antenna 3, and changes the phase corresponding to each antenna element. As a result, a transmission direction can be adjusted by a beam forming technology. As the phase shifter 14, a line switching type phase shifter, a reflection type phase shifter, or the like can be used.

As shown in FIG. 1, the radar transmission wave output from the transmission antenna 3 is reflected by a target object T to generate a reflected signal. The reflected signal is input to the reception antenna 4. The reception antenna 4 is also configured by a planar antenna using a patch antenna, for example, and receives a radar wave. Although not shown, the antenna elements of the transmission antenna 3 and the reception antenna 4 are disposed in parallel so that distances between the antenna elements adjacent to each other are equal to each other although not shown.

On the other hand, the receiver 9 includes a low noise amplifier (LNA) 16, an N-multiplier (MULTI) 17, a mixer (MIX) 18, an intermediate frequency amplifier (IF-AMP) 19, and an A/D converter (ADC) 20. The receiver 9 receives a signal through the reception antenna 4. The low noise amplifier 16 amplifies the received signal by a predetermined amplification degree, and outputs the amplified signal to the mixer 18. The N-multiplier 17 multiplies the signal output from the modulated-demodulated signal generator 7 by N and outputs the multiplied signal to the mixer 18.

The mixer 18 is configured as a frequency conversion unit, mixes an output signal of the low noise amplifier 16 with the modulated signal output from the N-multiplier 17, and outputs the mixed and frequency-converted signal to the intermediate frequency amplifier 19. The intermediate frequency amplifier 19 is configured by, for example, a variable amplifier, amplifies a signal according to the amplification degree set in the circuit control register 10, and outputs the amplified signal to the A/D converter 20. The A/D converter 20 converts the amplified analog signal into a digital signal and outputs the digital signal to the controller 5. The controller 5 includes a microcomputer having, for example, a CPU, a ROM, a RAM, and the like (all not shown), and acquires digital data converted by the receiver 9.

The millimeter wave radar system 1 employs the configuration described above so as to be mounted to be able to transmit a radar wave to a front side of the vehicle, for example, and transmits and receives a millimeter wave (for example, 80 GHz band: 76.5 GHz) band radar wave, and the controller 5 executes signal processing based on digital data acquired from the receiver 9 to calculate information on the target object T. The target object T is, for example, another vehicle such as a preceding vehicle or a roadside object on a road. The information related to the target object T is, for example, information based on a distance, a relative speed, an azimuth, or the like.

<Configuration of PLL Circuit 12>

Hereinafter, a configuration example of the PLL circuit 12 for radar, which is a part of the features of the present embodiment, will be described in detail. The PLL circuit 12 includes a band control logic 21 as a band setting unit, a level comparator 22 as a monitor unit, a voltage control oscillator (corresponding to a multi-band control oscillator hereinafter referred to as VCO) 23, a frequency divider 24, a multi modulus divider (MMD) 25, a phase comparator 26, a low-pass filter (LPF) 27 serving as a loop filter, a precharge voltage applicator 28, a fractional logic 29, and a band calibrator 30, and operates by inputting various signals from the ramp wave generator 11.

Figure 2:
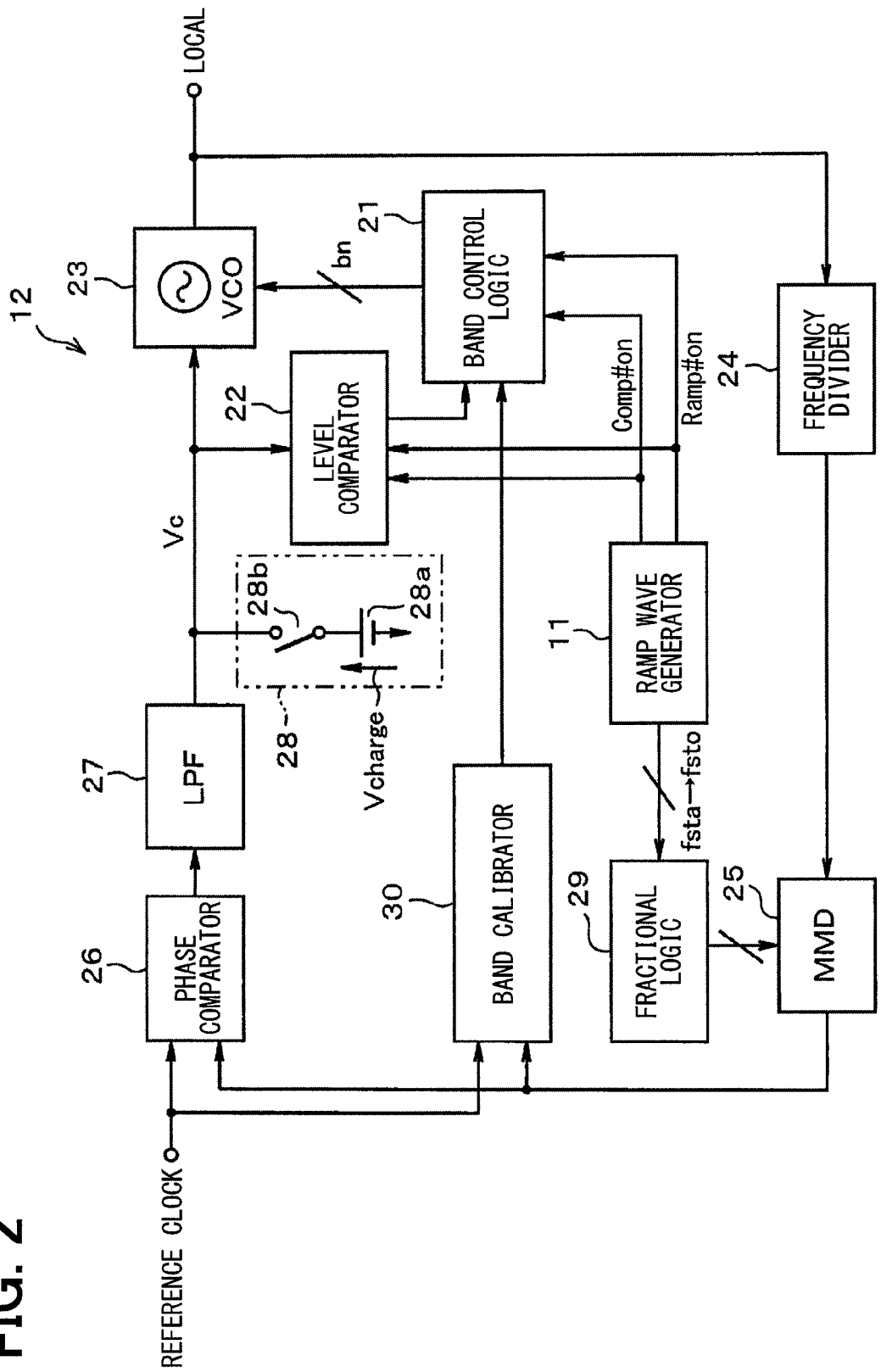
FIG. 2 is an electrical configuration diagram of a PLL circuit.

The precharge voltage applicator 28 outputs a VCO control voltage (corresponding to a control signal) Vc to the VCO 23, with the precharge voltage Vcharge as an initial voltage. As shown in FIG. 2, the precharge voltage applicator 28 includes a DC voltage source 28a and a precharge switch 28b, and the DC voltage source 28a outputs the precharge voltage Vcharge as a VCO control voltage Vc when the precharge switch 28b is turned on.

Figure 3:
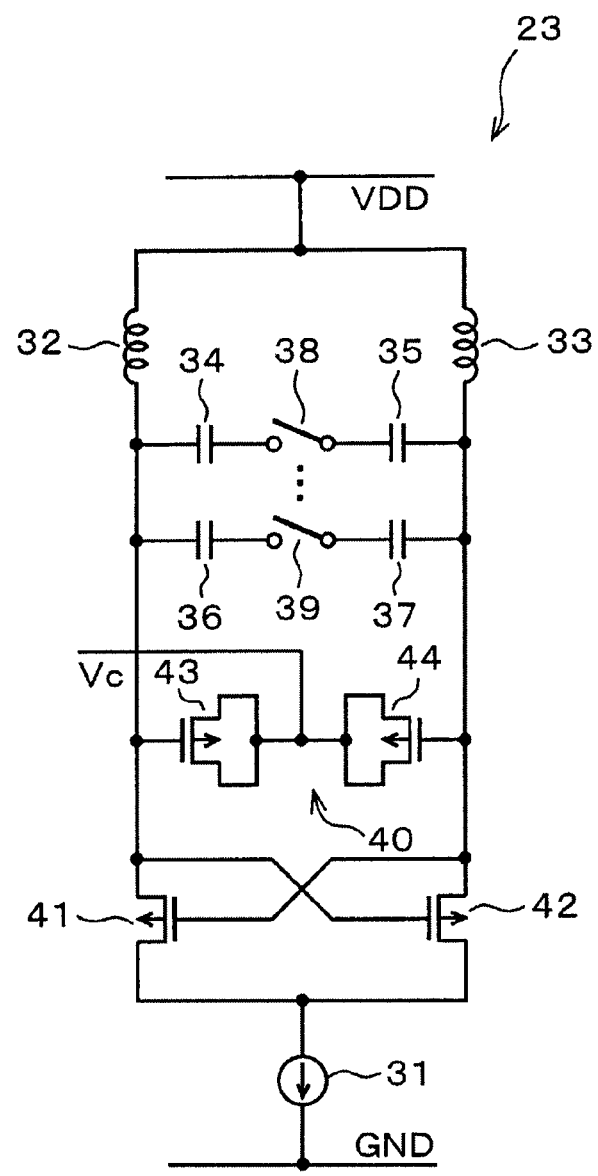
FIG. 3 shows a configuration example of a multi-band VCO.

The VCO 23 is configured to output a voltage corresponding to the input VCO control voltage Vc, and the detail of the VCO 23 is configured as exemplified in FIG. 3. The VCO 23 of FIG. 3 is configured by a so-called multi-band LC resonation type oscillation circuit, and includes a constant current source 31, inductors 32 and 33, fixed capacitive elements 34 to 37, control switches 38 to 39, a voltage controlled capacitance unit 40, and a pair of N-channel MOS transistors 41 and 42.

Sources of the MOS transistors 41 and 42 are commonly connected to each other and gates and drains of the MOS transistors 41 and 42 are connected with each other in an intersecting manner. The constant current source 31 is connected between the common source of the MOS transistors 41 and 42 and the ground. The inductors 32 and 33 are connected between the drains of the MOS transistors 41 and 42 and a supply node of the power supply voltage VDD, respectively. The control switch 38 and the fixed capacitive elements 34 and 35 are connected in series between the drains of the MOS transistors 41 and 42, and the control switch 39 and the fixed capacitive elements 36 and 37 are connected in series with each other.

The control switches 38 and 39 and the fixed capacitive elements 34 to 37 are connected in parallel between the drains of the pair of MOS transistors 41 and 42. Although only two series circuits of those control switches and the fixed capacitive elements are shown in FIG. 3, in reality, only the number (for example, 8: bit=256 gradations) corresponding to the number of gradations of a necessary band is connected in parallel to each other. The fixed capacitive elements 34 and 35 are set to the same capacitance value, and the fixed capacitive elements 36 and 37 are also set to the same capacitance value.

The ratio of a combined capacitance of the multiple fixed capacitive elements 34 and 35 connected in parallel to a combined capacitance of the fixed capacitive elements 36 and 37 is set to, for example, the ratio of the m power of 2 (m=0, 1, 2 . . . ) of a reference capacitance value. The control switches 38 to 39 can be switched on and off in accordance with a control signal supplied from the band control logic 21. Thus, the band control logic 21 provides control signals to each of the control switches 38 and 39 of the VCO 23 to determine on- and off-states of each of the control switches 38 and 39, thereby immobilizing a frequency variation range of the VCO 23. The frequency variation range is referred to as a band, and the band control logic 21 can switch on- and off-states of the control switches 38 and 39 to fix the frequency variation range to any one of multiple bands separated from each other, thereby being capable of setting the frequency variation range of the multi-band.

The voltage controlled capacitance unit 40 is connected between the drains of the MOS transistors 41 and 42. The voltage controlled capacitance unit 40 includes a pair of MOS transistors 43 and 44, the drain and source of which are commonly connected to each other. The voltage controlled capacitance unit 40 is configured by connecting the gatedrain source common connection node of the pair of MOS transistors 43 and 44 in series between the drains of the MOS transistors 41 and 42. When the VCO control voltage Vc is supplied to the voltage controlled capacitance unit 40, the capacitance value of the voltage controlled capacitance unit 40 changes. Since the oscillation frequency of the VCO 23 changes, the VCO 23 can output a signal having a frequency corresponding to the VCO control voltage Vc.

Figure 4:
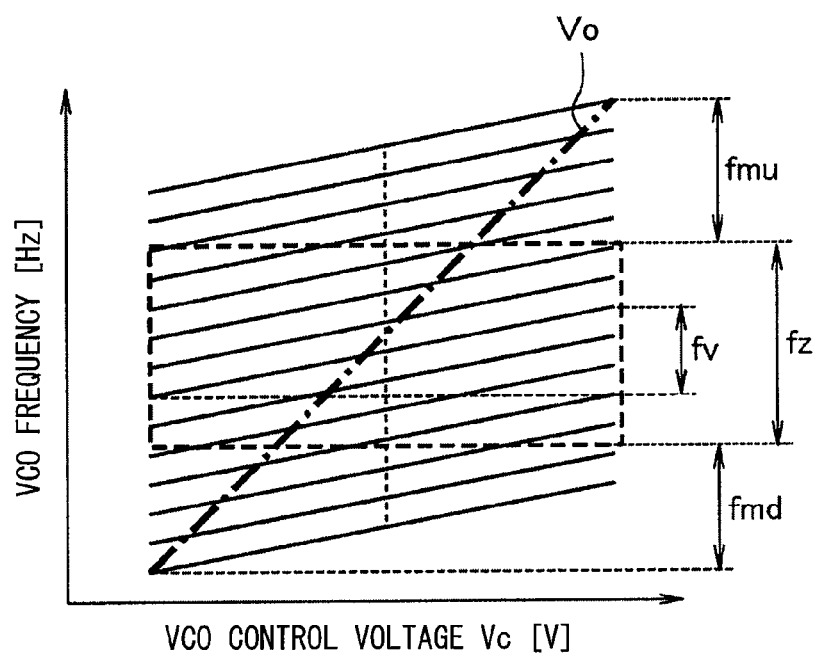
FIG. 4 is a characteristic diagram of VCO frequency versus VCO control voltage of a multi-band VCO.

FIG. 4 shows the frequency variation range of the multi-band. One solid line in FIG. 4 shows a variation range of the output frequency of the VCO 23 with respect to the VCO control voltage Vc in one band, and the frequency variation characteristic of the multi-band is a frequency characteristic in which multiple bands separated from each other are provided. The VCO 23 is configured to be capable of selectively switching one band among the multiple bands by the configuration described above.

As shown in FIG. 4, the VCO 23 is preferably designed by considering a standard frequency band fz of the milli-meter wave radar system 1 and a frequency band fv (that is, a modulated band) that is valid in one band. In addition, margin ranges fmu and fmd for calibrating variations due to manufacturing processes, power supply voltages, and changes in environmental temperatures (so-called PVTs) are desirably provided.

The marginal ranges fmu and fmd are provided above and below the standard frequency band fz of the millimeter wave radar system 1. As a result, even if the output frequency of the VCO 23 moves up and down due to the PVT variation, the marginal ranges fmu and fmd can cover the variation range within the standard frequency band fz, and an adverse effect due to the PVT variation can be avoided.

In general, when the frequency change range of the VCO 23 is desired to be widened, as shown by the voltage change characteristics Vo indicated by a one-dot chain line in FIG. 4, it is conceivable to configure the circuit so as to cover all the frequency ranges fz+fmu+fmd only by the capacitance change of the voltage controlled capacitance unit 40 in accordance with the change in the VCO control voltage Vc without providing the fixed capacitive elements 34 to 37. However, when such a configuration is employed, the characteristics of the VCO control voltage Vc and the output voltage Vo become too steep. For that reason, if noise is superimposed on the VCO control voltage Vc, the frequency variation of the output signal of the VCO 23 is increased in accordance with the noise, which is not preferable. For that reason, according to the present embodiment, a multi-band configuration is employed in which one of the fixed capacitive elements 34 to 37 are switched to another with the use of the control switches 38 and 39. Accordingly, the sensitivity of the conversion gain of the VCO 23 can be reduced, and excellent noise characteristics can be obtained.

The frequency divider 24 shown in FIG. 2 divides the frequency of the output signal of the VCO 23, converts the frequency of the output signal into a several-GHz band, and outputs the converted signal to the MMD 25. On the other hand, the ramp wave generator 11 generates a signal of a sawtooth wave whose slope changes with time as a digital signal, and outputs the digital signal to the fractional logic 29.

The fractional logic 29 is a division ratio setting module for determining the division ratio of the MMD 25, and changes the digital signal supplied from the ramp wave generator 11 according to a required operation frequency, changes a value to be supplied to the MMD 25, that is, a frequency division ratio, and supplies the changed frequency division ratio to the MMD 25. The MMD 25 is a multi-module divider for frequency-dividing the output obtained from the VCO 23 through the frequency divider 24 again, and divides the output signal of the frequency divider 24 again in accordance with the frequency division ratio given from the fractional logic 29, and outputs the frequency divided signal to the phase comparator 26 and the band calibrator 30. The phase comparator 26 outputs a signal in accordance with a phase difference between the reference clock and the output of the MMD 25, and the LPF 27 performs a low-pass filter processing on the output signal and outputs the filtered signal as the VCO control voltage Vc to the level comparator 22 and the VCO 23.

Figure 5:
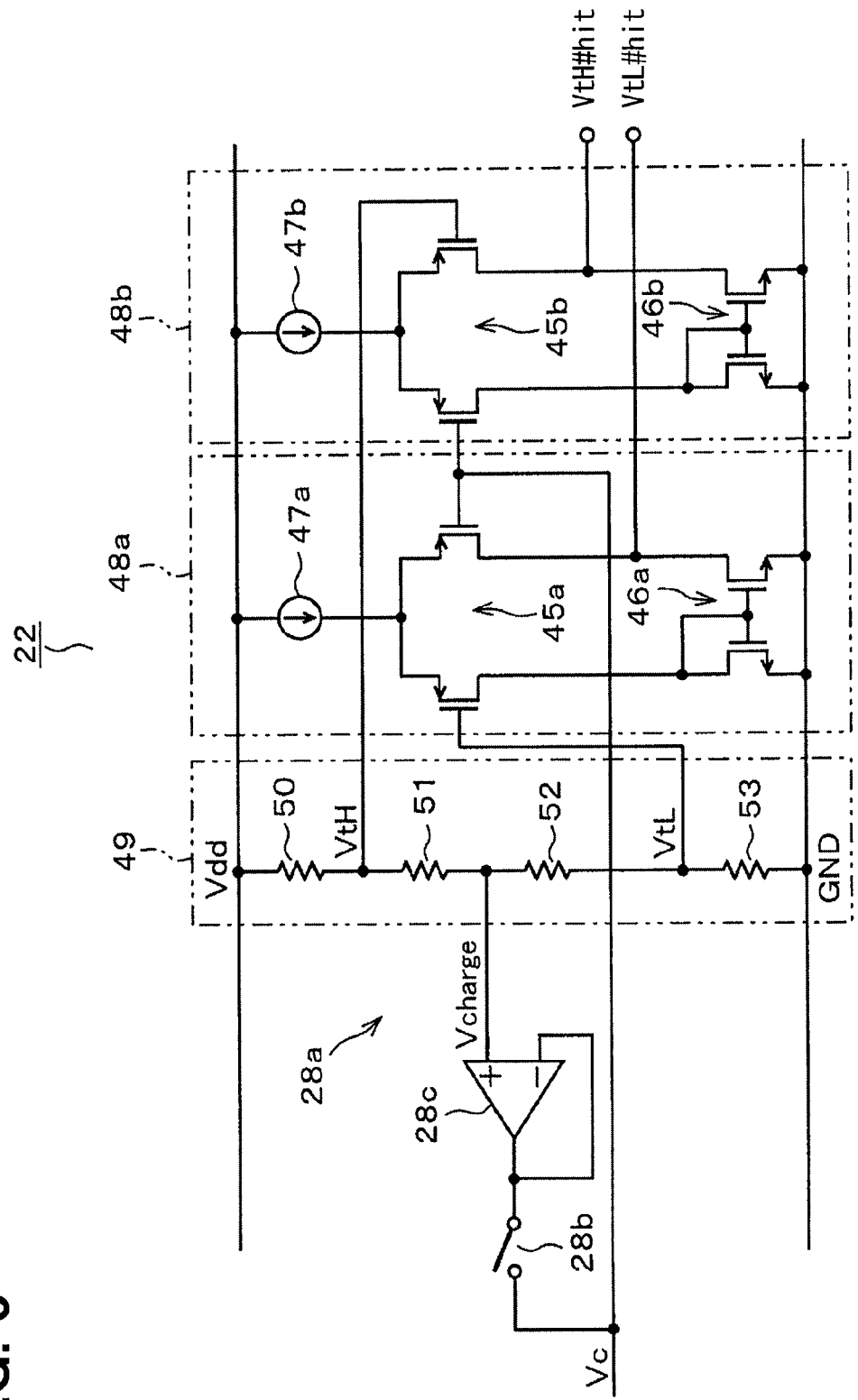
FIG. 5 shows a configuration example of a level comparator and a precharge voltage applicator.

FIG. 5 shows a configuration example of the voltage source 28a of the precharge voltage applicator 28 together with the level comparator 22. The level comparator 22 includes two pairs of comparators 48a and 48b having an illustrated form including differential pairs 45a and 45b, active loads 46a and 46b, and current sources 47a and 47b, and includes a voltage dividing circuit 49 for dividing the power supply voltage VDD, and functions as a monitor unit for monitoring the VCO control voltage Vc.

The voltage dividing circuit 49 includes resistors 50 to 53 connected in series between a supply node of the power supply voltage VDD and the ground GND, and generates an intermediate voltage (for example, VDD/4) obtained by dividing the power supply voltage VDD as a precharge voltage Vcharge. The voltage dividing circuit 49 divides and outputs an upper limit value VtH corresponding to an upper limit voltage of the VCO control voltage Vc at a voltage higher than the precharge voltage Vcharge, and divides and outputs a lower limit value VtL corresponding to a lower limit voltage of the VCO control voltage Vc at a voltage lower than the precharge voltage Vcharge.

One comparator 48b receives the lower limit value VtL generated by the voltage dividing circuit 49, compares the level of the lower limit value VtL and the level of the VCO control voltage Vc, and outputs a single-ended signal as a flag VtL # hit. The other comparator 48b receives the upper limit value VtH generated by the voltage dividing circuit 49, compares the level of the upper limit value VtH with that of the VCO control voltage Vc, and outputs a single-ended signal as a flag VtH # hit. Then, the flag VtL # hit changes when the VCO control voltage Vc is less than the lower limit value VtL, and the flag VtH # hit changes when the VCO control voltage Vc exceeds the upper limit value VtH. For that reason, the level comparator 22 compares the VCO control voltage Vc with the lower limit value VtL and the upper limit value VtH, thereby being capable of detecting in which range level of the lower value VtL and the upper limit value VtH the VCO control voltage Vc falls.

The voltage source 28a of the precharge voltage applicator 28 is configured to acquire the divided voltage of the voltage dividing circuit 49 as the precharge voltage Vcharge, and to output the acquired voltage as the VCO control voltage Vc from the voltage buffer 28c through the switch 28b.

When the frequency is gradually increased in one band with the use of the sawtooth modulation system, as shown in FIG. 4, it is desirable that the start frequency fsta corresponding to the relatively low VCO control voltage Vc is set to a low frequency, and the stop frequency fsto corresponding to the relatively high VCO control voltage Vc is set to a high frequency. Then, the variable frequency width corresponding to a change in the capacitance value of the voltage controlled capacitance unit 40 can be kept as wide as possible.

It is preferable that the VCO control voltage Vc corresponding to the start frequency fsta satisfying the above condition is set to a value (for example, VDD/4) lower than the half value of the power supply voltage VDD. At this time, the upper limit value VtH and the lower limit value VtL are set to a value slightly larger or smaller (for example, VDD/4+0.1 V, VDD/4−0.1 V) than the above-mentioned value lower than the half value of the power supply voltage VDD, respectively, in accordance with a value (for example, VDD/4) lower than the half value of the power supply voltage VDD. The upper limit deviation and the lower limit deviation (for example, 0.1 V) are set to the same value. The band control logic 21 can determine whether or not the VCO control voltage Vc falls within the range within the upper limit value VtH and the lower limit value VtL with reference to the flags VtH # hit and VtL # hit.

Considering the circuit configuration of FIG. 5, since the precharge voltage Vcharge is similarly linearly changed according to the upper limit value VtH and the lower limit value VtL for determination and PVT (a variation in a process, the power supply voltage, and a temperature), the voltage difference is stably output without being affected by the PVT.

On the other hand, the ramp wave generator 11 shown in FIG. 2 transmits a ramp control signal Ramp # on to the band control logic 21. The band control logic 21 is configured to receive the ramp control signal Ramp # on, receives the output of the level comparator 22, and controls the control switches 38 and 39 of the VCO 23 to turn on or off in response to those input signals to select the band of the VCO 23. In FIG. 2, a comparison control signal Comp # on is illustrated in parallel with the ramp control signal Ramp # on. In the present embodiment, the processing is performed without using the comparison control signal Comp # on. The comparison control signal Comp # on is used to measure a comparative timing in a third embodiment to be described below, and is illustrated in order to facilitate the understanding of the description of the third embodiment.

The VCO 23 outputs the reference signal, for example, in a 40 GHz band, in accordance with the VCO control voltage Vc input through the low-pass filter 27 by controlling the control switches 38 to 39 to be on or off by the band control logic 21. The band calibrator 30 is provided for receiving the output of the MMD 25 and the reference clock and calibrating the band corresponding to the start frequency fsta of the VCO control voltage Vc, and is configured to automatically switch the band using, for example, a binary search method. The reference clock is a dock signal having a reference frequency. The band calibrator 30 calibrates which band the frequency corresponding to the VCO control voltage Vc corresponds to, based on the comparison result of comparing the phases of the reference clock and the signal obtained by dividing the output signal of the VCO 23 by the frequency divider 24 and the MMD 25.

The operation of the configuration described above will be described with reference to a flowchart of FIG. 6 and illustrative diagrams of FIGS. 7 to 9. At S1 of FIG. 6, the band calibrator 30 executes a band calibration process at a start frequency fsta(0). At that time, the band calibrator 30 opens a PLL loop (for example, the output of the LPF 27), turns on the switch 28b of the precharge voltage applicator 28, fixes the output of the voltage source 28a as the VCO control voltage Vc to the precharge voltage Vcharge, and sequentially switches the band from a center band of the multi-band (for example, the band b128 in the case of 256 gradations) in accordance with the frequency division ratio of the set start frequency fsta(0) through a binary search method.

Figure 7:
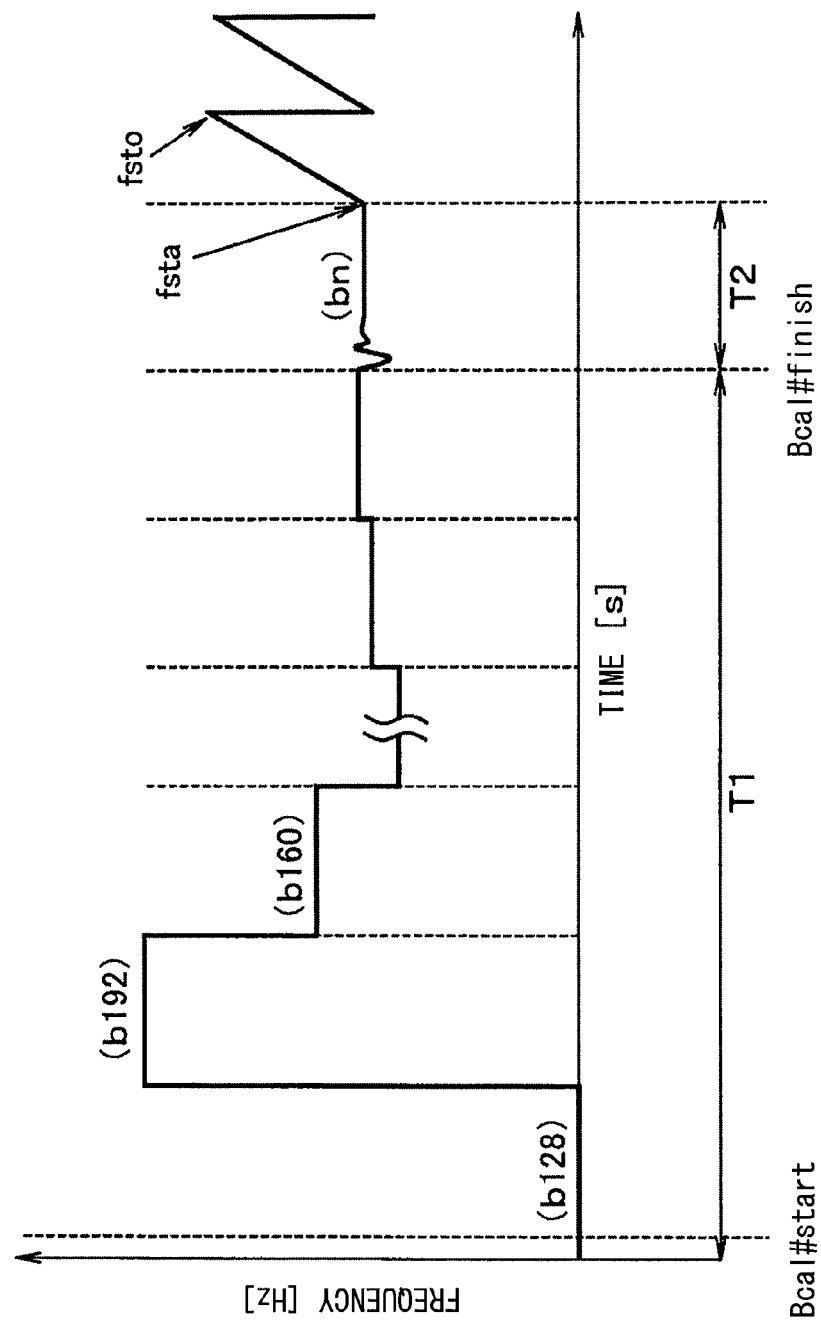
FIG. 7 is a first illustrative view of a band calibration process.
Figure 8:
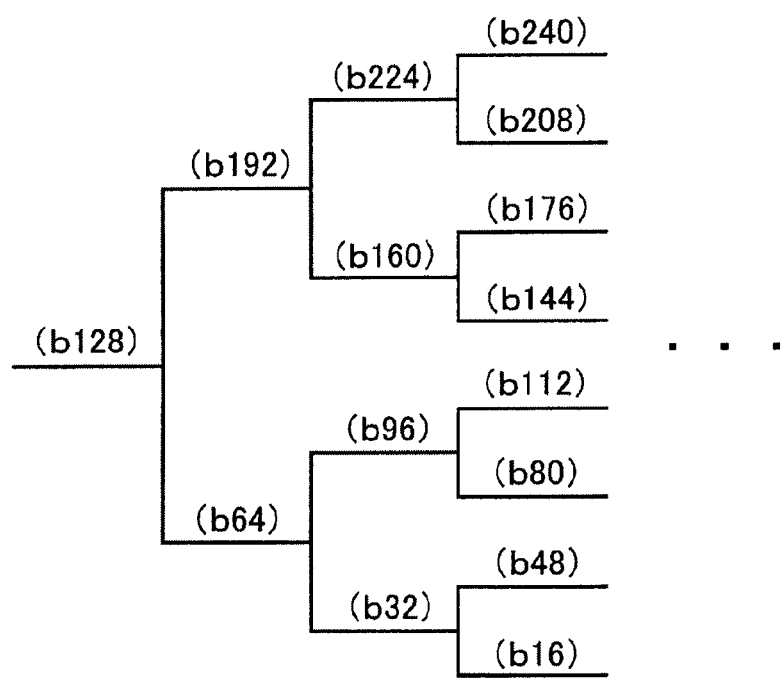
FIG. 8 is a second illustrative view of the band calibration process.

FIG. 7 shows an example of a band switching patter along the binary search method. As shown in FIG. 7, the band calibrator 30 sets the band to a center band b128 at the timing Bcal # start, and switches the band in accordance with a phase difference between the output of the MMD 25 and the reference dock output. The band switching method is performed by controlling the control switches 38 to 39 to be on or off by the band control logic 21.

The band calibrator 30 repeats the above process by the number of bits (for example, 8) to select an optimum band bn corresponding to the start frequency fsta(0). After determining the optimum band bn corresponding to the start frequency fsta(0) at a timing Bcal # finish, the band calibrator 30 turns off the switch 28b of the precharge voltage applicator 28 and closes the PLL loop to phase-lock the PLL at a period T2. As a result, the band calibrator 30 can select the optimum band bn and lock the PLL while switching the band by the binary search method. FIG. 8 schematically shows a band switching method by the binary search method, and with the application of the binary search method, for example, any one of the 8 bits=256 bands can be selected as the optimum band bn.

Figure 6:
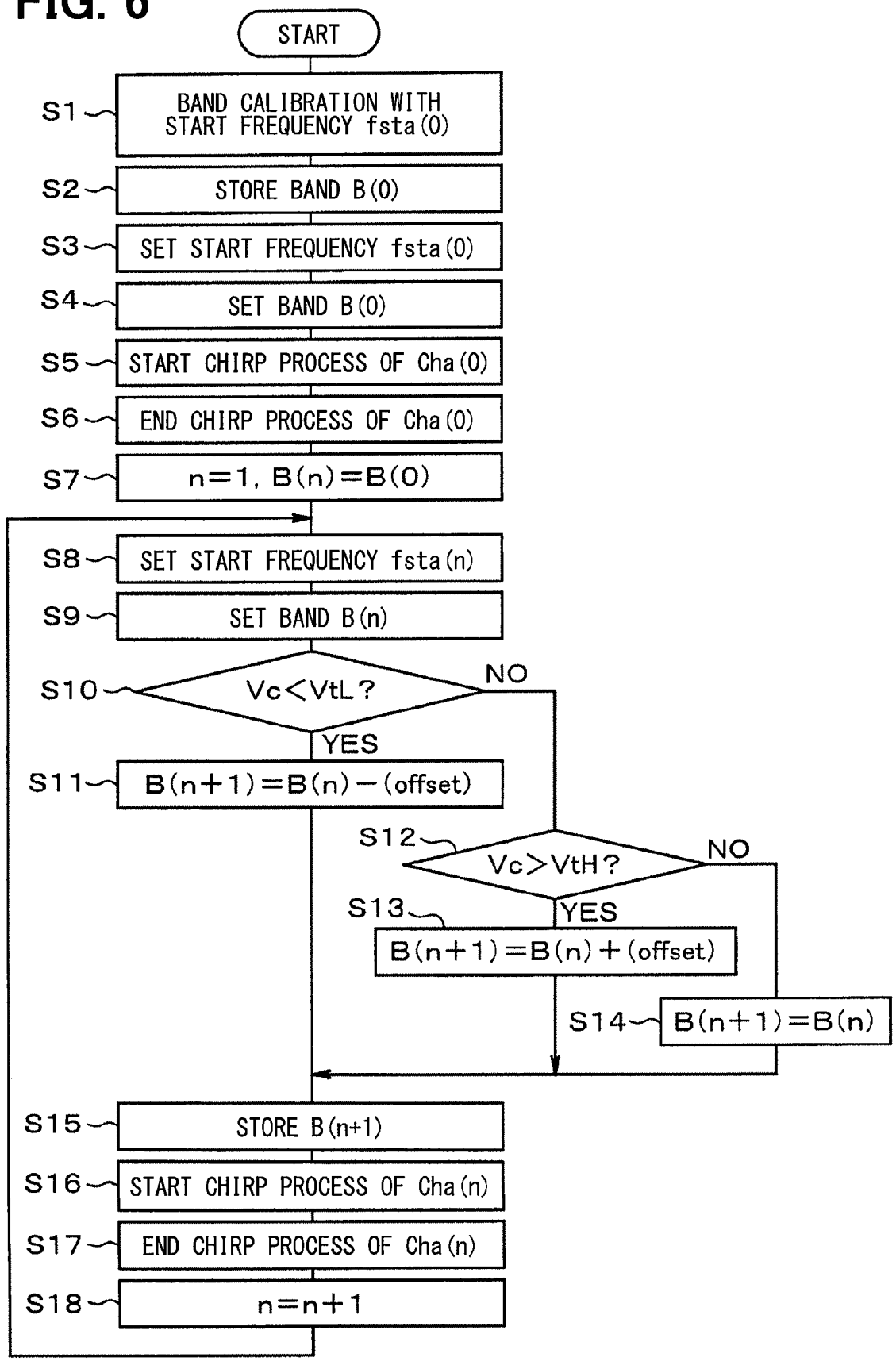
FIG. 6 is a flowchart illustrating processing operation.

As shown in FIG. 6, the band control logic 21 stores the band bn adjusted by the band calibrator 30 at S2 as the band B(0), sets the start frequency fsta(0) in accordance with the frequency command input at S3, sets the band B(0) at S4, and starts the chirp process of gradually changing (that is, gradually increasing or decreasing) the frequency with the elapse of time along the chirp pattern Cha(0) at S5.

Figure 9:
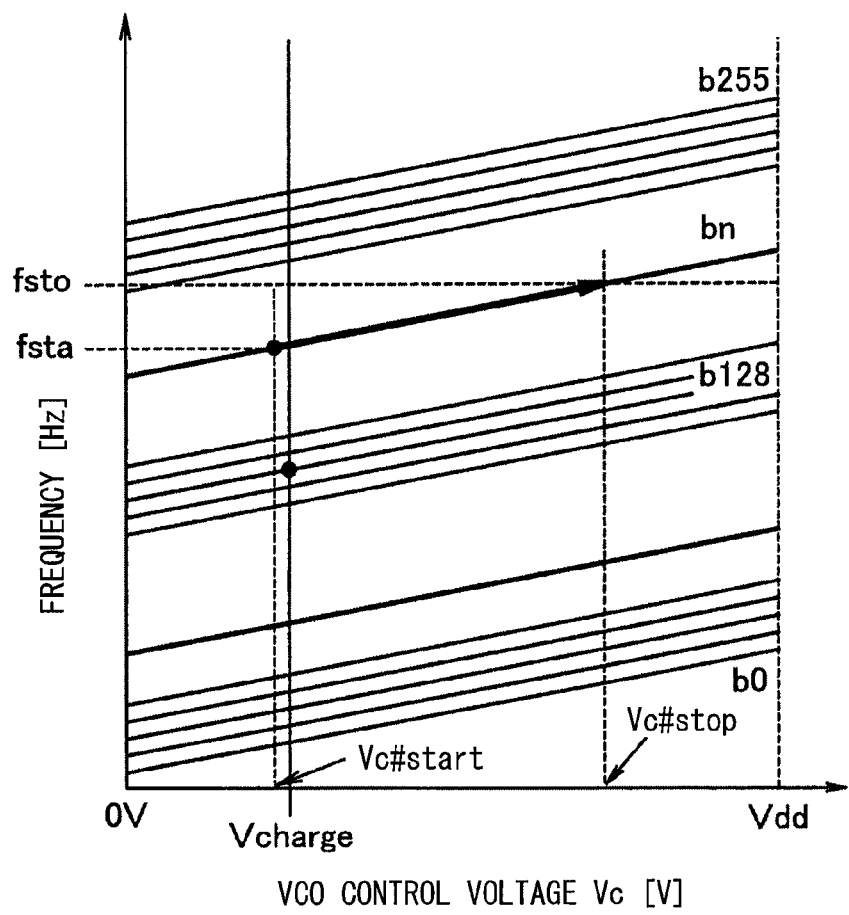
FIG. 9 is a third illustrative view of the band calibration process.

FIG. 9 shows a frequency change due to the chirp process. If a form of an upchirp control is described, as shown in FIG. 9, in one band bn, the VCO control voltage Vc is changed from a start voltage Vc # start to a stop voltage Vc # stop, thereby changing the oscillation frequency from the start frequency fsta to the stop frequency fsto.

Figure 10:
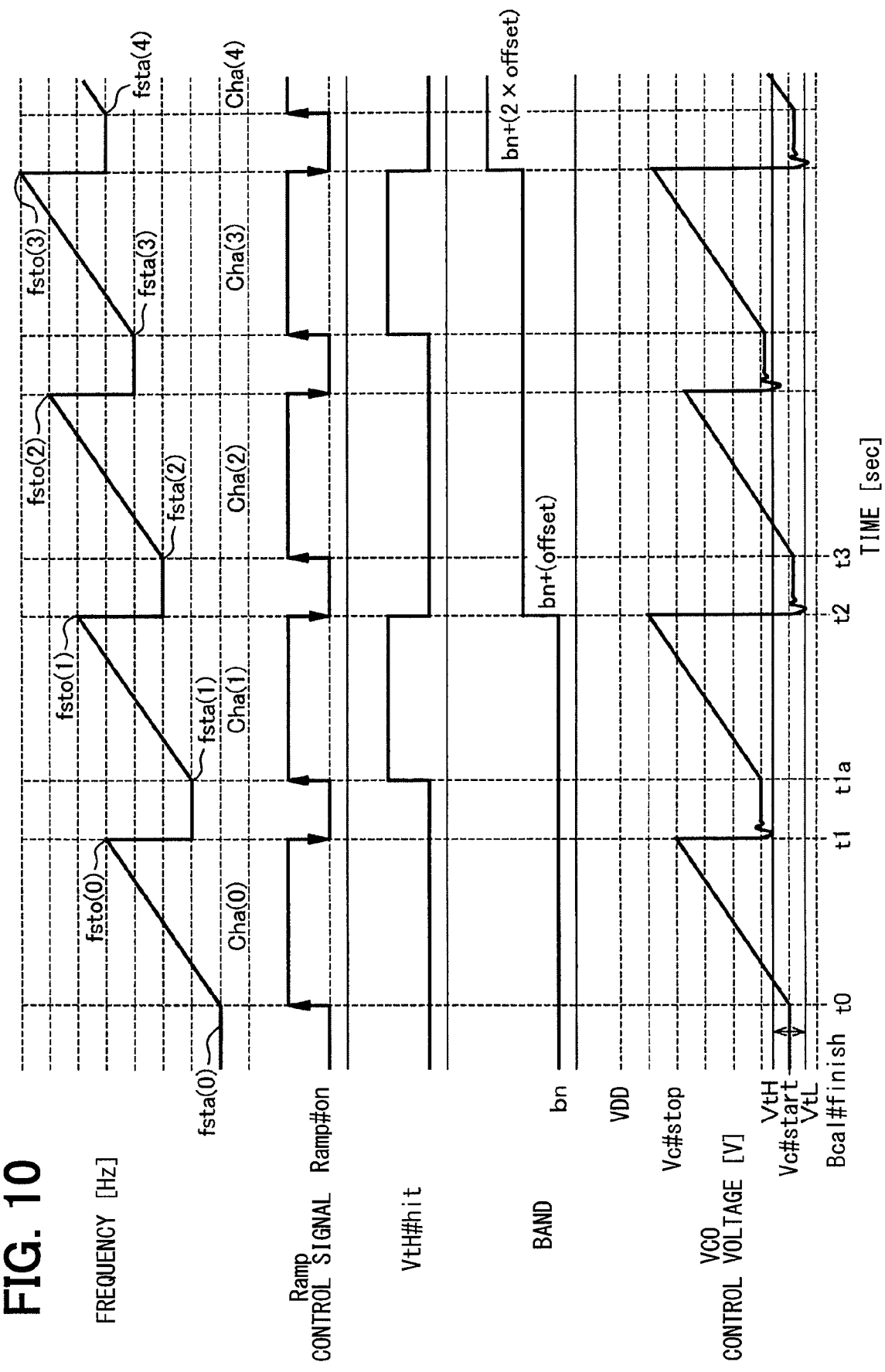
FIG. 10 is a timing chart showing a frequency change pattern.

For example, as shown in FIG. 10, as a unique frequency change pattern, a mode of up-chirp control while changing the start frequency in a stepwise manner will be described.

As shown in FIG. 10, the ramp wave generator 11 outputs a rising signal of the ramp control signal Ramp # on to the band control logic 21 at a timing t0 and outputs a control signal to the fractional logic 29 to change the frequency by monotonically increasing the frequency along the chirp pattern Cha(0) from the start frequency fsta(0). At that time, the ramp wave generator 11 sets the final frequency varied along the chirp pattern Cha(0) as the stop frequency fsto(0), and lowers the ramp control signal Ramp # on at a timing t1 when reaching the stop frequency fsto(0). As a result, the chirp process of the chirp pattern Cha(0) is completed at S6.

Thereafter, the ramp wave generator 11 sets the variable n to 1, sets a band B(n) to be equal to the band B(0) at S7 of FIG. 6, sets the start frequency fsta(n) corresponding to the variable n at S8, and sets the band B(n) corresponding to the variable n at S9.

At that time, the band B(n) is maintained as the band bn, but the frequency is set to the start frequency fsta(1). In the present embodiment, the start frequency fsta(1) is set to an intermediate frequency higher than the start frequency fsta(0) and lower than the stop frequency fsto(0). For that reason, at S8 and S9, the control voltage of the VCO control voltage Vc is abruptly changed to a voltage corresponding to the start frequency fsta(1) in the band bn.

The ramp wave generator 11 outputs the ramp control signal Ramp # on to the level comparator 22 and the band control logic 21 at a timing after the elapse of a predetermined time (timing of t1a in FIG. 10) which takes a phase-lock control time in the PLL loop into account, and the band control logic 21 refers to the output flags VtH # hit and VtL # hit of the level comparator 22 at a time after receiving the ramp control signal Ramp # on to determine which range level specified by the upper limit value VtH and the lower limit value VtL the VCO control voltage Vc falls within.

The band control logic 21 determines whether or not the VCO control voltage Vc<lower limit value VtL is satisfied according to the output flag VtL # hit of the level comparator 22 at S10 of FIG. 6, and when the determination at S10 is YES, the band control logic 21 sets a next band B(n+1)=B(n)−(offset) at S11. In other words, the band control logic 21 reduces the frequency of the band B(n+1) by the offset frequency offset.

When the determination at S10 of FIG. 6 is NO, the band control logic 21 proceeds to S12, and determines whether or not the VCO control voltage Vc>the upper limit value VtH is satisfied at S12 based on the output flag VtH # hit of the level comparator 22. When the determination at S12 is YES, the band control logic 21 instructs the ramp wave generator 11 to set the next band B(n+1)=B(n)+(offset) at S13. In other words, the ramp wave generator 11 is a band for increasing the frequency of the band bn by the offset frequency offset.

The offset frequency offset is a frequency that can be set based on a VCO gain Kv [GHz/V] and a band frequency step [MHz/code]. For example, when the VCO gain Kv=1.2 [GHz/V], the band frequency step=40 [MHz/code], and the threshold voltage of the level comparator 22 are designed to be the upper limit value VtH=Vcharge+0.1 [V], the offset frequency offset can be estimated to be +3 [code], and the band bn can be changed by +3. When the determinations at both of S10 and S12 are NO, the band control logic 21 proceeds to S14, and instructs the ramp wave generator 11 to set the next band B(n+1)=B(n) at S14. In other words, the ramp wave generator 11 sets the next band B(n+1) to be the same as the present band B(n).

Then, at S15, the ramp wave generator 11 stores the band B(n+1) set at S11, S13, or S14 in an internal memory, starts an n-th chirp process at S16, ends the n-th chirp process at S17, sets n=n+1 at S18, returns the process to S8, and repeats the above processing.

In other words, at S8 to S18 of FIG. 6, the ramp wave generator 11 updates the band B(n+1) with one cycle delay at a falling timing of the ramp control signal Ramp # on. For that reason, the ramp wave generator 11 can set the band B(n+1) with a margin at a timing t2 before a rising timing t3 of the next ramp control signal Ramp # on. As a result, immediately before setting the band B(n+1), a determination processing time for determining whether or not the frequency deviates from the frequency band that can be set in the band B(n) is not required.

In the subsequent processing, as shown in FIG. 10, the ramp wave generator 11 sets the start frequencies fsta(2), fsta(3), fsta(4) . . . , and the stop frequencies fsto(2), the fsto(3) . . . to perform chirp processing while incrementing n, and the band control logic 21 changes the set band of the VCO 23 to a band corresponding to the offset frequency offset every two chirp processing. In the present embodiment, the start frequency fsta(n) is set to be higher than a start frequency fsta(n−1) of a previous loop cycle n−1 and lower than a stop frequency fsto(n−1). For that reason, as shown in FIG. 10, the VCO control voltage Vc exceeds the upper limit value VtH every two times, and the band bn is adjusted to a band corresponding to a frequency obtained by adding the offset frequency offset every two times.

<Conceptual Conclusion of the Present Embodiment>

According to the present embodiment, the frequency width to be up-chirped (gradually increased) in one band can be kept as wide as possible, and the VCO control voltage Vc can be controlled without saturation. In addition, the frequency variable width can be further expanded and changed in a stepwise manner more than the frequency width gradually increased in one band, so that a unique frequency change pattern can be adopted.

In addition, since the band control logic 21 sets the band B(2) used in the next start frequency fsta(2) after the ramp wave generator 11 finishes outputting the ramp control signal Ramp # on gradually increasing from the previous start frequency fsta(0) (corresponding to a first start frequency) to the previous stop frequency fsto(0) before the ramp wave generator 11 starts outputting the ramp control signal Ramp # on gradually increasing from the present start frequency fsta(1) (corresponding to a second start frequency). Therefore, the band control logic 21 can set the frequency band Bn with a margin even when adopting the unique frequency change pattern described above.

In particular, since the frequency is changed stepwise in a stepwise manner, the millimeter wave radar system 1 can be controlled with the use of a larger number of frequency change patterns, and an interference with other devices can be prevented as much as possible.

Also, before the ramp wave generator 11 starts outputting the ramp control signal Ramp # on gradually increasing from the second start frequency fsta (1), the level comparator 22 monitors the VCO control voltage Vc varying in response to the input frequency command, and the band control logic 21 sets the band B in response to the VCO control voltage Vc. As a more detailed example, the band control logic 21 monitors the VCO control voltage Vc by the level comparator 22, determines whether or not the VCO control voltage Vc falls within a predetermined range, adds or subtracts an offset to or from the previous band B(n) if not falling with the predetermined range, and sets the band B(n+1) to be used for the next time subsequent to the present time so as to fall within the predetermined range. With the execution of the processing described above, the band B can be adjusted in accordance with the actual VCO control voltage Vc, and the band B can be set in accordance with an influence of the PVT variation even if the influence occurs.

<Description of Incidental Effects of First Embodiment>

Figure 11:
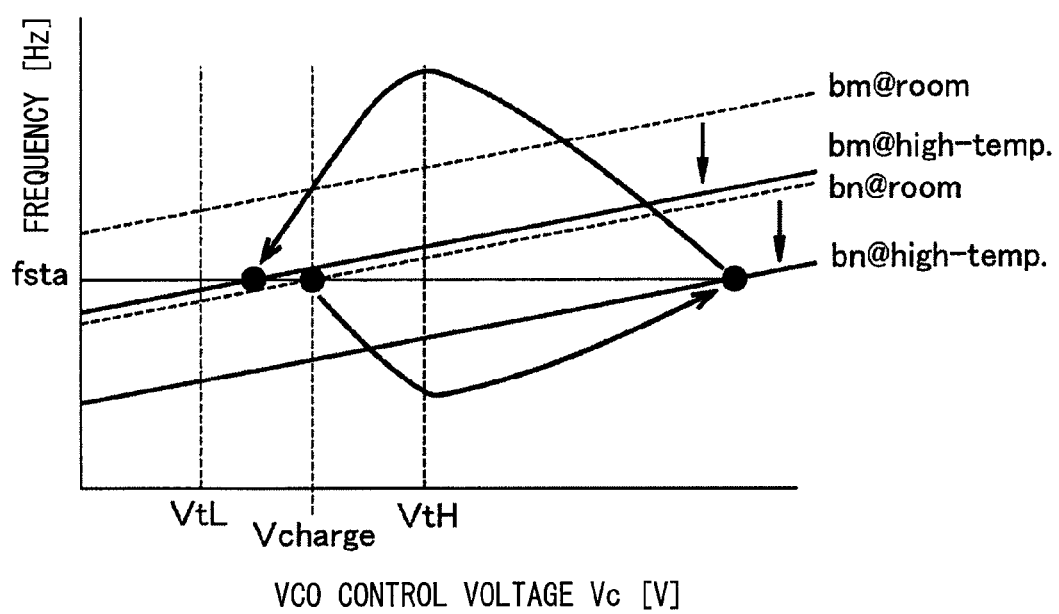
FIG. 11 is an illustrative view of an incidental effect.

FIG. 11 is an illustrative diagram illustrating incidental effects. In the first embodiment, since the condition determination processes S10 and S12 are performed with the use of the level comparator 22, even when the oscillation frequency of the VCO 23 varies due to an influence of a change in the power supply voltage or the temperature, the oscillation frequency can be corrected in real time so as to absorb the influence of the variation.

FIG. 11 shows a dependency of the VCO control voltage Vc on the output frequency of the VCO 23 according to the temperature change. For example, after the band calibrator 30 is band calibrated at the start frequency fsta(0), the output frequency of the VCO 23 tends to be low when the temperature rises due to an internal heat generation of the integrated circuit 2. Refer to "bn@room"→"bn@high-temp" property in FIG. 11.

In order to set the output frequency of the VCO 23 to the specified start frequency fsta, the band bn is offset-corrected with the use of the configuration of the first embodiment and switched to the band bm. As a result, the VCO control voltage Vc can fall within a range between the lower limit value VtL and the upper limit value VtH. Therefore, even if the environmental temperature rises, the VCO control voltage Vc can be set to the prescribed start frequency fsta by being set within the range between the lower limit value VtL and the upper limit value VtH.

In this case, for example, in the case where the present disclosure is applied to a vehicle application, the power supply voltage may drop as the current consumed by the battery increases, but also in that case, the VCO control voltage Vc of the start frequency fsta can be set between the lower limit value VtL and the upper limit value VtH by setting the bands in the same manner. In other words, with the use of the level comparator 22, the VCO control voltage Vc can be corrected to an initial state of calibration.

In short, even if the dependency characteristics of the VCO control voltage Vc of the band frequency change in accordance with the effect of the PVT variation, the band can be set so that the VCO control voltage Vc corresponding to the start frequency fsta falls within a predetermined range. In addition, if the PLL circuit is prepared on hardware as shown in FIGS. 1 and 2, the design can be easily changed by software.

Second Embodiment

Figure 12:
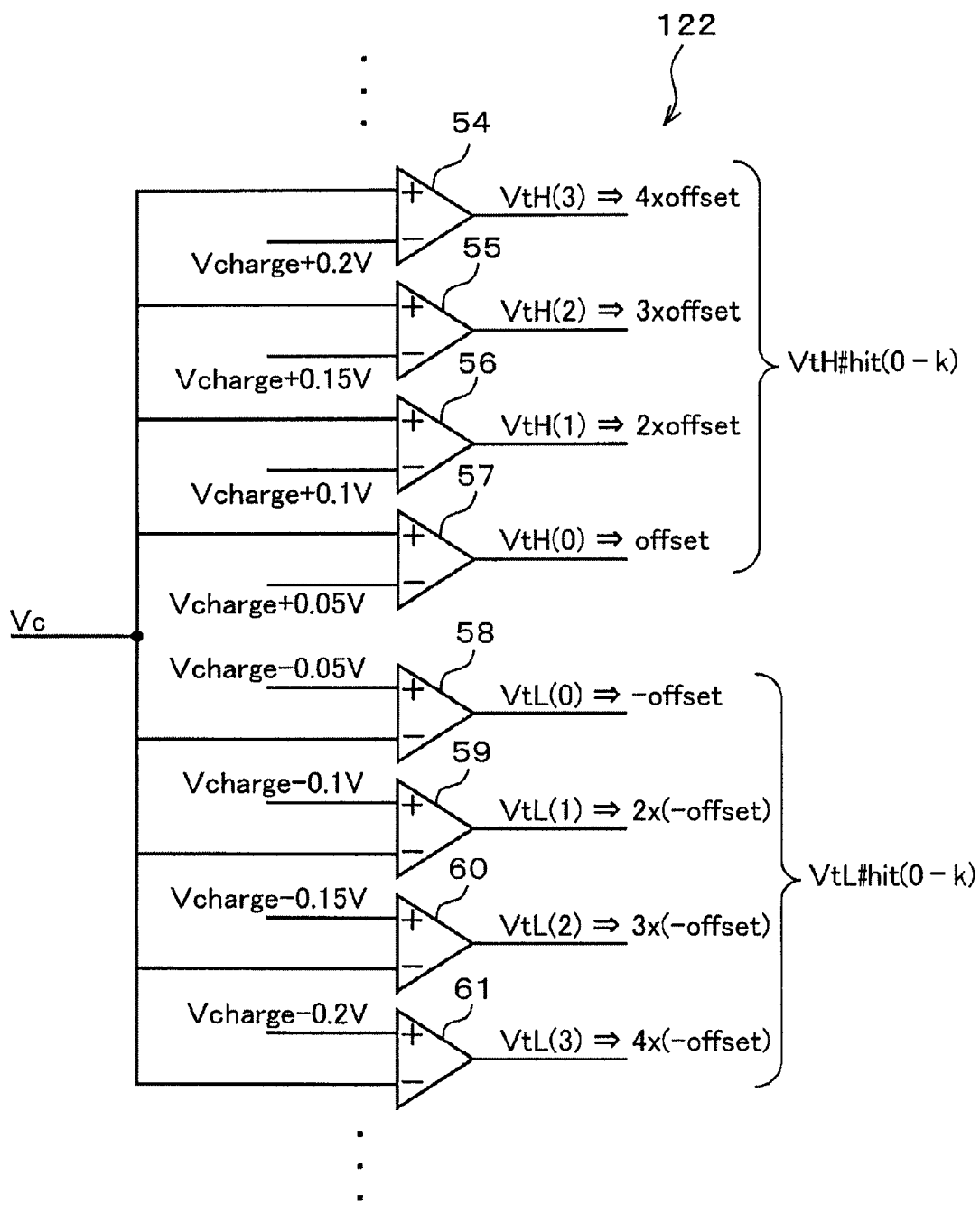
FIG. 12 shows a configuration example of a multilevel comparator according to a second embodiment.

FIG. 12 shows an additional illustrative diagram of a second embodiment. For example, when a power supply voltage abruptly varies, an output frequency of a VCO 23 may vary greatly. Also, for example, when a frequency change pattern is set to be unique, a start frequency fsta may be set to be frequency-hopped with the use of a so-called frequency spread technique.

In such a case, when the level comparator 22 shown in FIG. 5 according to the first embodiment is used, there is no need to loop the processing of S8 to S18 shown in FIG. 6 multiple times even if the frequency variation is followed only once in order to follow the frequency variation caused by, for example, the environmental change, or/and the frequency variation caused by the frequency hopping pattern, which takes a long time.

In such a case, it is desirable to use a multilevel comparator 122 shown in FIG. 12 instead of the level comparator 22 shown in FIG. 5. As shown in FIG. 12, the multilevel comparator 122 as a monitor unit provides multiple thresholds for the precharge voltage Vcharge at regular intervals (for example, 0.05 V) and detects a voltage deviation of a VCO control voltage Vc relative to the precharge voltage Vcharge by comparing the thresholds with the VCO control voltage Vc with the use of comparators 54 to 61.

By referring to the comparison results of the comparators 54 to 61 of the multilevel comparator 122 as flags, the band control logic 21 can determine how many times the offset amount should be changed with respect to a unit offset amount offset. An example shown in FIG. 12 shows an example in which the offset amount offset is changed linearly and stepwise with respect to the deviation of the thresholds. In the examples shown in FIG. 12, the thresholds are prepared as low thresholds Vcharge−0.05, Vcharge−0.1, Vcharge−0.15, Vcharge−0.2 . . . , and high thresholds Vcharge+0.05, Vcharge+0.1, Vcharge+0.15, Vcharge+0.2 . . . , and the respective flags generated according to the value of the VCO control voltage Vc are set as high threshold flags VtH # hit (0 to k) and low threshold flags VtL # hit (0 to k). When the high threshold flags VtH # hit(0 to k) occur, the offset is set so that VtH(0)→offset, VtH(1)→2× offset, VtH(2)→3× offset, VtH(3)→4× offset, and when the low threshold flags VtL # hit(0 to k) occur, the offset is set so that VtL(0)→−offset, VtL(1)→−2× offset, VtL(2)→−3× offset, VtL(3)→−4× offset, . . . .

As a result, the excess amount or the decrease amount with respect to the threshold value can be set stepwise, and with the execution of the loop processing a smaller number of times (for example, once), it is possible to follow the variation of the frequency based on the PVT or the frequency hopping pattern, for example.

<Conceptual Conclusion of the Present Embodiment>

In short, according to the present embodiment, the frequency can be subjected to the frequency spread change so as to perform frequency hopping with a smaller number of processing times, thereby being capable of adopting a unique frequency change pattern.

Further, according to the present embodiment, the VCO control voltage Vc is monitored by the multilevel comparator 122, the VCO control voltage Vc is compared with predetermined multiple stages of the low thresholds Vcharge− 0.05 . . . and the multiple stages of the high thresholds Vcharge+0.05 . . . . When the VCO control voltage Vc is smaller than the low threshold, an offset of a multiple corresponding to a difference between the VCO control voltage Vc and each of the low threshold Vcharge− 0.05 . . . is subtracted from the information on the previous band B(n) to set the next band B(n+1) to be subsequent bands after the present time. When the VCO control voltage Vc is larger than the high thresholds Vcharge+0.05 . . . , an offset of a multiple corresponding to a difference between the VCO control voltage Vc and each of the high threshold Vcharge+0.05 . . . is added to the information on the previous band B(n) to set the next band B to be subsequent bands after the present time. For that reason, the frequency variation based on the PVT or the frequency hopping pattern can be followed with a smaller number of processes.

Third Embodiment

Figure 13:
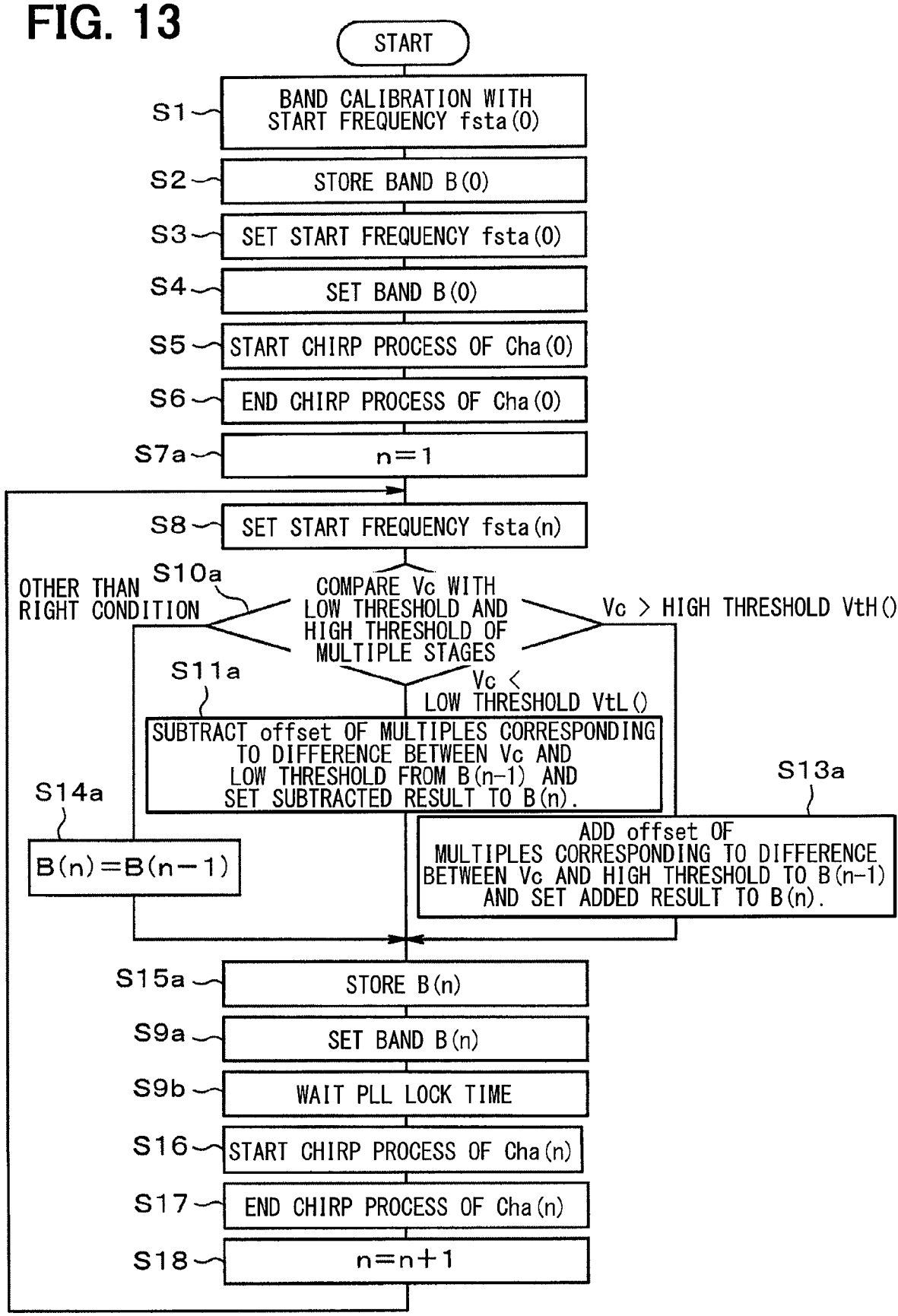
FIG. 13 is a flowchart illustrating processing operation according to a third embodiment.
Figure 14:
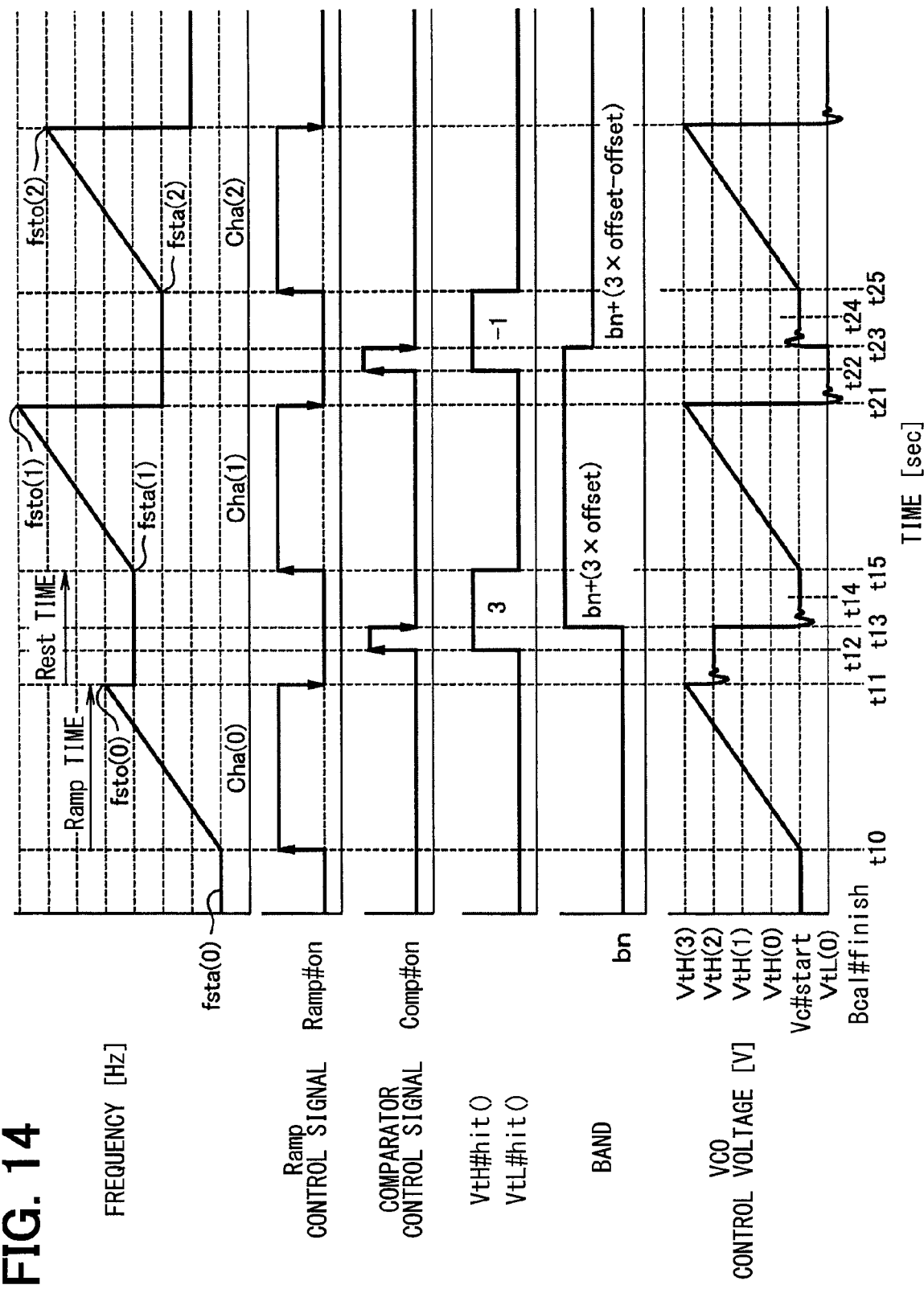
FIG. 14 is a timing chart showing a frequency change pattern.

FIGS. 13 and 14 show additional illustrative diagrams of a third embodiment Processing steps that perform the same processing as the processing steps described in the first embodiment are denoted by the same step numbers, and descriptions of the same processing steps will be omitted, or processing steps that perform similar processing are denoted by the subscript "a" in the description. In the present embodiment, a configuration using a multilevel comparator 122 described in the second embodiment will be described.

For example, when a start frequency fsta is randomly set with the use of a technique such as frequency hopping, there is a fear that the variation cannot be correctly set by a setting method (corresponding to the setting of a next band) of a band B(n+1) delayed by one cycle as shown in the first embodiment. In such a case, it is desirable to perform correction in real time as much as possible. Therefore, in the present embodiment, with the execution of the processing of a flowchart shown in FIG. 13, a present band B(n) can be set with the use of a previous band B(n−1).

First, at S1, the band calibrator 30 executes a band calibration process at a start frequency fsta(0). Then, the band control logic 21 stores a band B(0) adjusted by the band calibration at S2, sets a start frequency fsta(0) at S3, sets the band B(0) at S4, and starts a chirp process of gradually changing (that is, gradually increasing or decreasing) the frequency with the elapse of time along a chirp pattern Cha(0) at S5.

For example, in a mode of performing an upchirp control, a ramp wave generator 11 outputs a rising signal of a ramp control signal Ramp # on, and outputs a control signal to the fractional logic 29 at a timing t10, thereby increasing and changing the frequency monotonically along a chirped pattern Cha(0) from a start frequency fsta(0).

At that time, the ramp wave generator 11 sets a final frequency that has been varied along the chirp pattern Cha(0) as a stop frequency fsto(0), and falls a ramp control signal Ramp # on at a timing t11 when reaching the stop frequency fsto(0). As a result, the chirp process of the chirp pattern Cha(0) is completed at S6. Refer to a Ramp time at timings t10 to t11.

Thereafter, the ramp wave generator 11 sets the variable n to 1 at S7a of FIG. 13, and sets the start frequency fsta(n) corresponding to the variable n at S8. In the present embodiment, the start frequency fsta(1) is set to an intermediate frequency higher than the start frequency fsta(0) and lower than the stop frequency fsto(0). At that time, the band B(n) is maintained as the band bn, but the frequency is set to the start frequency fsta(1). For that reason, at S8, the control voltage of the VCO control voltage Vc is abruptly changed to a voltage corresponding to a start frequency fsta(1) in the band bn.

The ramp wave generator 11 outputs a rising signal of a comparison control signal Comp # on to the multilevel comparator 122 and the band control logic 21 at a timing after a predetermined time elapsed (t12 in FIG. 14) that takes a phase-lock control time in the PLL loop into account. The band control logic 21 refers to the low threshold flags VtL (0 to k) and the high threshold flags VtH (0 to k) of the multilevel comparator 122 at a timing when receiving the rising signal of the comparison control signal Comp # on (hereinafter, 0 to k in parenthesis are omitted as needed) to determine which range level specified by the threshold VtL( ) or VtH( ) the VCO control voltage Vc falls within.

At S10a of FIG. 13, the band control logic 21 determines a magnitude relationship between the VCO control voltage Vc and the low threshold value VtL( ) according to the output low threshold flag VtL( ) of the multilevel comparator 122, and determines a magnitude relationship between the VCO control voltage Vc and the high threshold value VtH( ) according to the output high threshold flag VtH( ) of the multilevel comparator 122.

When it is determined at S10a that Vc<low threshold VtL( ) is satisfied, the band control logic 21 commands the ramp wave generator 11 so as to subtract the offset of a multiple corresponding to a difference between the VCO control voltage Vc and the low threshold VtL( ) from a frequency band of a previous band B(n−1) at S11a to set the frequency band of the present band B(n). Then, the process proceeds to S15a.

As shown in FIG. 12, for example, when the flag VtL # hit(0) of the threshold VtL(0) by the multilevel comparator 122 is turned on (="H"), and the flags VtL # hit(1 to k) of the thresholds VtL(1 to k) are turned off (="L"), the band control logic 21 commands the ramp wave generator 11 to subtract the offset of one time from the frequency band of the previous band B(0) and set the frequency band of the present band B(1). When the flags VtL # hit(0 to 2) of the thresholds VtL(0 to 2) are turned on by the multilevel comparator 122 and the flags VtL # hit(3 to k) of the thresholds VtL(3 to k) is turned off, the band control logic 21 commands the ramp wave generator 11 to subtract the offset 3× offset three times from the frequency band of the previous band B(0) and set to the frequency band of the present band B(1).

On the other hand, when it is determined that Vc>the high threshold value VtH( ) is satisfied at S10a of FIG. 13, the band control logic 21 commands the ramp wave generator 11 to add an offset of a multiple corresponding to a difference between the VCO control voltage Vc and the high threshold value VtH( ) from the previous band B(n−1) and set to the present band B(n) at S13a. Then, the process proceeds to S15a.

As shown in FIG. 12, for example, when the flag VtH # hit(0) of the threshold value VtH(0) by the multilevel comparator 122 is turned on (="H"), and the flags VtH # hit(1 to k) of the thresholds VtH(1 to k) are turned off (="L"), the band control logic 21 commands the ramp wave generator 11 to add an offset of one time from the frequency band of the previous band B(0) to set the present band B(1). When the flags VtH # hit(0 to 2) of the thresholds VtH(0 to 2) are turned on by the multilevel comparator 122 and the flags VtH # hit(3 to k) of the thresholds VtH(3 to k) are turned off, the band control logic 21 commands the ramp wave generator 11 to add an offset 3× offset three times from the previous band B(0) to set the present band B(1).

At a timing t12 of FIG. 14, since the VCO control voltage Vc has reached the threshold VtH(2), the flags VtH # hit(0 to 2) of the thresholds VtH(0 to 2) by the multilevel comparator 122 are turned on, and the flags VtH # hit(3 to k) of the thresholds VtH(3 to k) are turned off (refer to "VtH # hit( )=3" of FIG. 14).

When it is determined at S10a of FIG. 13 that neither Vc<low threshold VtL( ) nor Vc>high threshold VtH( ) is satisfied, the band control logic 21 determines as other cases and shifts to S14a, and commands the ramp wave generator 11 to maintain the the previous band B(n−1) as the present band B(n) at S14a. Then, the process proceeds to S15a.

At S15a, the ramp wave generator 11 stores the band B(n) commanded at S11a, S13a, or S14a and lowers the comparison control signal Comp # on at S9a. The ramp wave generator 11 resets the band B(n) at a falling timing t13 of the comparison control signal Comp # on and waits only for the PLL lock time at S9b. Refer to timings t13 to t14 in FIG. 14.

In other words, the ramp wave generator 11 executes a first PLL locking process from the timing t11 after the (n−1)-th chirp process while keeping the band B(n−1) (timings t11 to t12), and thereafter, changes the band B(n−1) to the band B(n) to execute a second PLL locking process (timings t13 to t14). At that time, since the n-th band B(n) is used to lock the PLL frequency to the start frequency fsta(n), a wait time for stabilizing the VCO control voltage Vc for determination, a wait time for relocking after correcting the band B(n), and a double wait time are provided as a resting time (Rest time). Then, the ramp wave generator 11 starts an n-th chirp process at S16 (timing t15 in FIG. 14), and ends the n-th chirp process at S17 (timing t21 in FIG. 14). Then, the ramp wave generator 11 sets n=n+1 at S18, and the process returns to S8, and repeats the processing. With the repetition of the processing in this manner, even if a variation width of the VCO control voltage Vc is limited, since the band B(n) can be changed one by one, the variation width of the VCO control voltage Vc can be substantially reduced to the frequency variation range of the chirp processing.

Thereafter, the processing is repeated in the same manner, but the band control logic 21 waits until the VCO control voltage Vc for determination is stabilized at timings t21 to t22 of FIG. 14, refers to the output flags VtH( ) and VtL( ) of the multilevel comparator 122 at the timing t22, commands the ramp wave generator 11 to set a next band B(n+1) corresponding to that level, and the band control logic 21 changes to the band B(n+1) at a timing t23 at which the ramp wave generator 11 outputs the falling signal of the comparison control signal Comp # on. The ramp wave generator 11 waits until the PLL is re-locked after the correction of the band B(n+1) (timing t23 to t24), and then starts the chirp process for the (n+1)-th time from the subsequent timing t25. As a result, the same operation and effects as those of the embodiments described above can be obtained.

Fourth Embodiment

Figure 15:
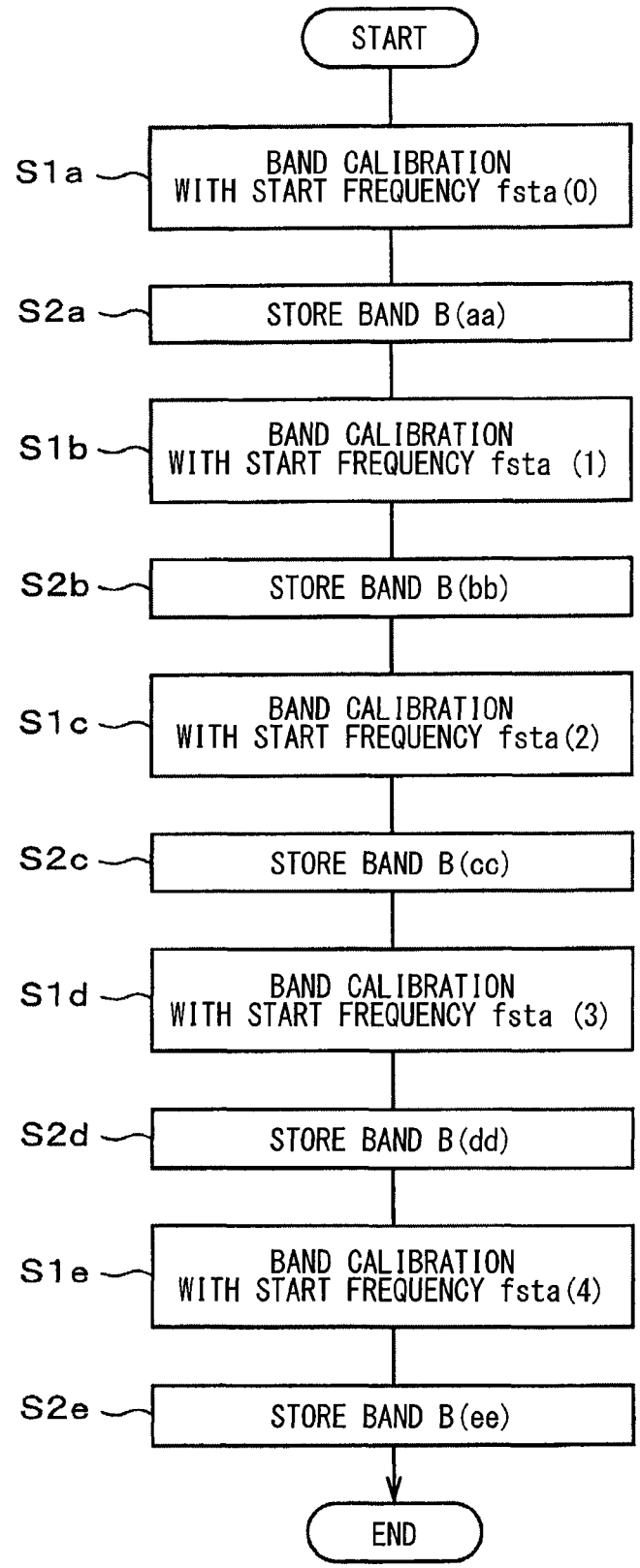
FIG. 15 is a first flowchart illustrating processing operation according to a fourth embodiment.
Figure 16:
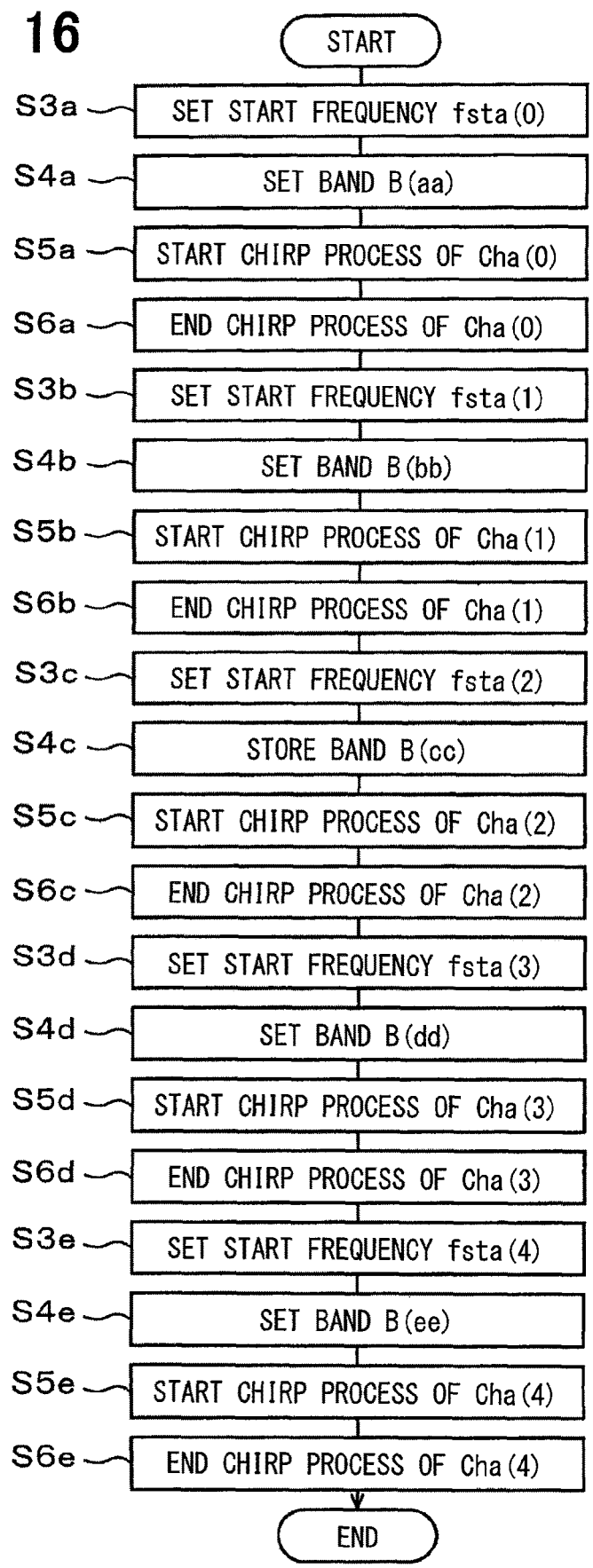
FIG. 16 is a second flowchart illustrating the processing operation.
Figure 17:
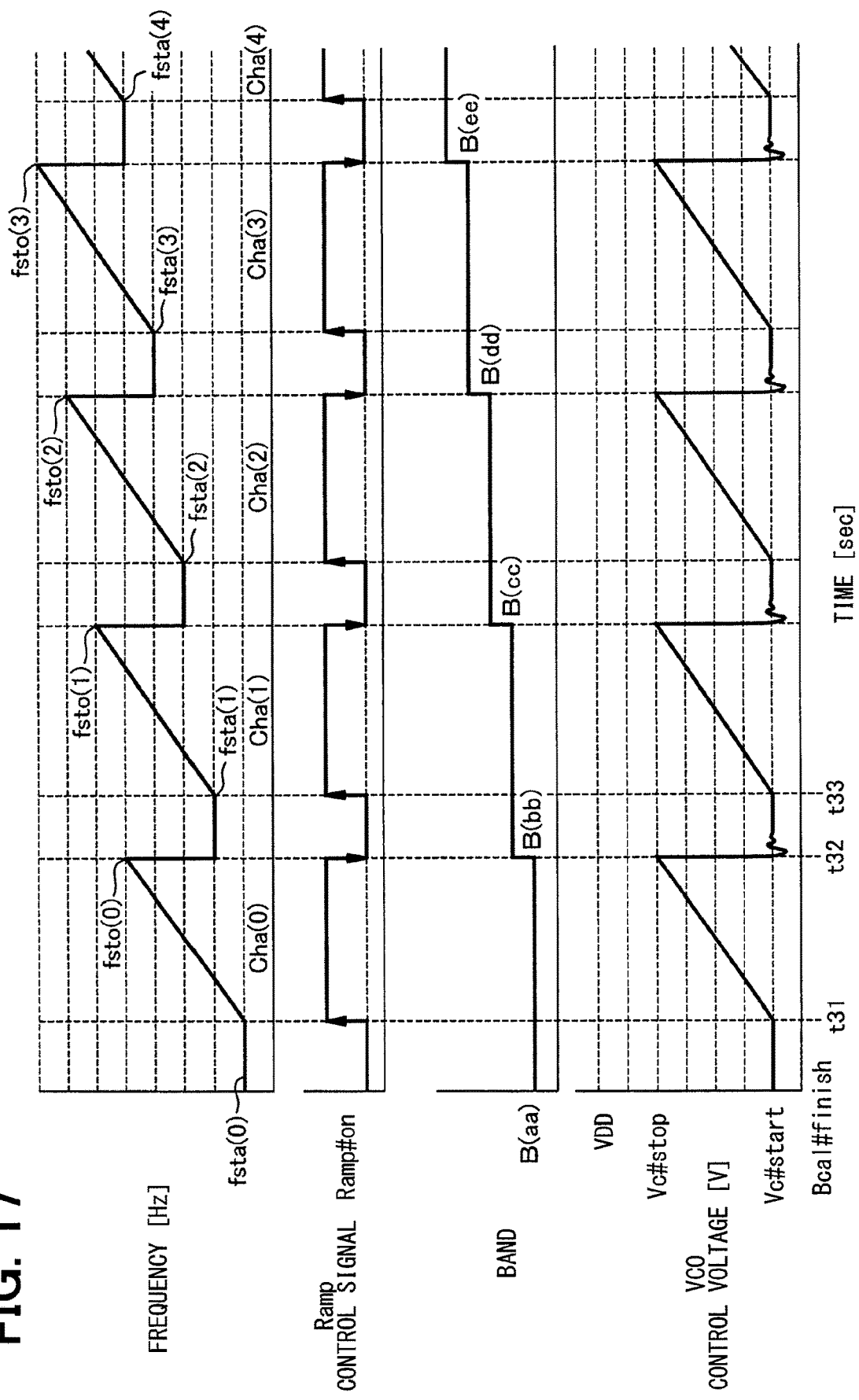
FIG. 17 is a timing chart showing a frequency change pattern.

FIGS. 15 to 17 show additional illustrative diagrams of a fourth embodiment Processing steps that perform the same processing as the processing steps described in the first and third embodiments will be described with the same step numbers or with subscripts a to e.

In the third embodiment, two PLL-lock times are waited each time the bands are changed, so that the rest time (Rest time) may be prolonged. In the present embodiment, for example, when the hopping frequency of the start frequency fsta is set in the circuit control register 10 in advance, the PLL lock time is shortened by performing a preliminary band calibration process shown in FIG. 15 before performing the frequency hopping process to store the calibration information in a table of an internal memory, and then setting the band to the band B(n) on which the band calibration process is performed in advance, as shown in FIG. 16.

As shown in FIG. 15, the band calibrator 30 performs the band calibration process at the start frequencies fsta(0) to fsta(4) at S1a to S1e, and stores the calibration results of the respective bands B(aa) to B(ee) in an internal memory (not illustrated) at S2a to S2e. In this example, the band calibrator 30 calibrates which band B( ) the frequency corresponding to the VCO control voltage Vc corresponds to, based on the result of comparing the phases of the reference clock and the signal obtained by frequency-dividing the output signal of the VCO 23. In this example, an example in which the processing is repeated five times is given, but it is preferable that the processing is repeated by the set number of the frequency hopping patterns.

As shown in FIG. 16, the ramp wave generator 11 sets the start frequency fsta(0) at S3a, sets a band B(aa) at S4a, starts the chirp process along the chirp pattern Cha(0) at S5a, and ends the chirp process at S6a. Similarly, the subsequent start frequencies fsta(1), fsta(2), fsta(3) . . . are sequentially set and repeated (S3b to S6b, S3c to S6c, S3d to S6d).

As illustrated in FIG. 17, after the band calibration process is finished at the timing Bcal # finish, the chirp process along the chirp pattern Cha(0) of the band B(aa) is initiated at a rising timing t31 of the ramp control signal Ramp # on, and the chirp process is finished at a falling timing t32 of the ramp control signal Ramp # on.

Thereafter, before the chirp process along the chirp pattern Cha(1) is started in the next band B(bb), the band may be changed to the band B(bb) on which the calibration processing has been performed in advance corresponding to the start frequency fsta(1). For that reason, the ramp wave generator 11 only needs to set the band B(bb) by referring to a table of the internal memory, and can quickly set the band B(bb). At that time, the waiting process of the PLL lock time only needs to be performed once between the timings t32 and t33 in FIG. 17, and the rest time at the timing of changing the band B(bb) can be shortened. Since the subsequent processing is the same, a description of the same processing will be omitted.

In short, according to the present embodiment, since the band is set with reference to the correspondence table of the calibration result by the band calibrator 30, the rest time can be shortened.

Fifth Embodiment

Figure 18:
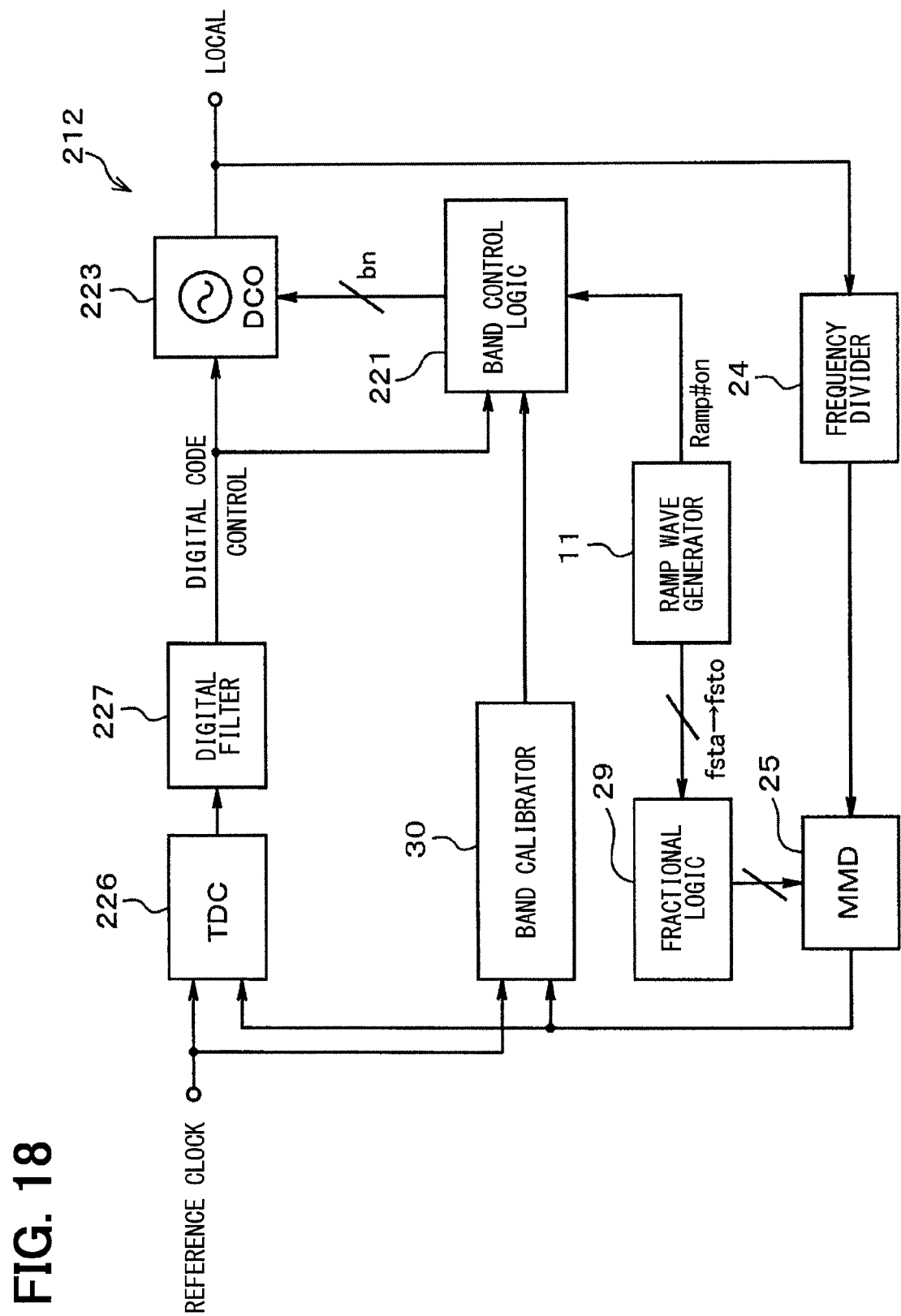
FIG. 18 is an electrical configuration diagram of a PLL circuit according to a fifth embodiment.

FIG. 18 shows an additional illustrative diagram of a fifth embodiment. FIG. 18 shows an exemplary configuration of a digital PLL 212 using a DCO (Digital Control Oscillator) 223 as a multi-band control oscillator. The digital PLL 212 includes a frequency divider 24, an MMD 25, a ramp wave generator 11, a fractional logic 29, a band calibrator 30 as well as a TDC (Time to Digital Converter) 226 that replaces the phase comparator 26, a digital filter 227 that replaces the low-pass filter 27, a DCO 223 that replaces the VCO 23, and a band control logic 221 that replaces the band control logic 21.

The TDC 226 outputs a time of a phase difference between the reference clock and an output of the MMD 25 as digital data, and the digital filter 227 performs filter processing on the digital data and outputs the digital data as a digital code to the DCO 223 and the band control logic 221. In that case, the DCO 223 is not voltage-controlled but is controlled by a digital code. The DCO 223 includes a control capacitance unit (not illustrated) whose capacitance can be changed by being switched by the digital code supplied from the digital filter 227, instead of the voltage controlled capacitance unit 40 of the VCO 23 shown in FIG. 3, and the capacitance of the control capacitance unit can be changed from the band control logic 221. As a result, the DCO 223 is configured as a multi-band controlled oscillator.

Even when the DCO 223 is employed, the multi-band calibration method and the frequency pattern changing method are the same as those described in the embodiments described above, and therefore their descriptions will be omitted. In order to prevent saturation of the output digital code of the digital filter 227, the band control logic 221 is configured to read back the output digital code of the digital filter 227. For that reason, the same operation and effects as those of the embodiments described above can be achieved, and the level comparator 22 or the multilevel comparator 122 described in the above-described embodiments can be unnecessary.

Other Embodiments

The present disclosure is not limited to the embodiments described above, but can be implemented by various modifications, and can be applied to various embodiments without departing from the spirit of the present disclosure. For example, the following variations or extensions can be performed.

The present disclosure is applied to the millimeter wave band radar system, but is not limited to the millimeter wave band radar. In the embodiments described above, an example has been described in which the modulation system of gradually increasing the frequency in the sawtooth wave shape in a range of one band is applied, but the present disclosure is not limited to the above example, and for example, a modulation system of gradually decreasing the frequency may be applied, an FMCW modulation system of linearly increasing the frequency in a range of one band and then linearly decreasing the frequency may be applied, or a method of non-linearly changing the frequency in a range of one band may be applied. For that reason, the present disclosure is not limited to the method described in the embodiments described above.

Although the description has been given with reference to the configuration of the VCO 23 and the DCO 223, the configuration of the oscillator is not limited to the configuration of the LC oscillation circuit shown in FIG. 3 or the configuration of the DCO 223 similar to the LC-oscillator circuit if a circuit configuration including the multi-frequency band is provided. For example, a ring oscillation circuit in which a logic inversion circuit is connected in a ring shape may be used, or an oscillator having another type of multi-band configuration may be used.

For example, the configuration of each of the embodiments described above is conceptual, and the functions of one component may be distributed to a plurality of components, or the functions of a plurality of components may be integrated into one component. In addition, at least a part of the configuration of the embodiments described above may be replaced with a known configuration having a similar function. In addition, some or all of the configurations of the two or more embodiments described above may be combined with each other or substituted as necessary. The configurations and functions of the plurality of embodiments described above may be combined together. Part of the embodiments described above can be regarded as embodiments even in the manner of omitting the aspects as far as the problems can be solved. Also, all conceivable aspects to an extent not departing from the essence specified by the wording defined by the claims can be also regarded as embodiments.

Although the present disclosure has been described in accordance with the embodiments described above, it is understood that the present disclosure is not limited to such embodiments or structures. The present disclosure encompasses various modifications and variations within the scope of equivalents. In addition, various combinations and configurations, as well as other combinations and configurations, including one element, more, or less, are within the scope and spirit of the present disclosure.

What is claimed is:

1. A phase locked loop (PLL) circuit for radar configured to generate a reference signal and to be used in a radar system including a transmitter, a receiver, and a control command generator, the transmitter generating a radar transmission wave in response to the reference signal and transmitting the radar transmission wave to a target object, the receiver receiving a reflected signal reflected from the target object in response to the reference signal, the control command generator generating and outputting a control command to the PLL circuit, the PLL circuit comprising:
   a multi-band control oscillator having a plurality of bands that gradually increases or decreases a frequency in response to a control signal and is separated from each other, the multi-band control oscillator configured to be capable of selectively switching one band among the plurality of bands, and configured to generate a signal of a frequency corresponding to the control signal in the band that is switched as the reference signal;
   a band setting unit configured to set the band of the multi-band control oscillator; and
   a monitor unit configured to monitor the control signal changing in accordance with an input frequency command before the control command generator starts outputting the control command to gradually increase or decrease the frequency from a present start frequency, wherein
   the band setting unit is configured to set the band to be used for a present or subsequent time after the control command generator finishes outputting the control command to gradually increase or decrease the frequency from a previous start frequency to a previous stop frequency and before the control command generator starts outputting the control command to gradually increase or decrease the frequency from the present start frequency, and
   the monitor unit is configured to monitor a value of the control signal and to determine whether the value of the control signal falls within a predetermined range, and the band setting unit is configured to set a band to be used for the present or subsequent time to fall within the predetermined range by adding an offset to or subtracting an offset from information on the previous band when the value does not fall within the predetermined range.

2. The PLL circuit according to claim 1, wherein the band setting unit is configured to set the band to be used for the present time.

3. The PLL circuit according to claim 1, wherein the band setting unit is configured to set the band to be used for a next time subsequent to the present time.

4. The PLL circuit according to claim 1, further comprising
   a band calibrator configured to calibrate which band the frequency corresponding to the control signal corresponds to in advance based on a comparison result of comparing a phase of a reference clock with a phase of a signal obtained by dividing an output signal of the multi-band control oscillator, wherein
   the band setting unit is configured to set the band with reference to the calibration result.

5. A phase locked loop (PLL) circuit for radar configured to generate a reference signal and to be used in a radar system including a transmitter, a receiver, and a control command generator, the transmitter generating a radar transmission wave in response to the reference signal and transmitting the radar transmission wave to a target object, the receiver receiving a reflected signal reflected from the target object in response to the reference signal, the control command generator generating and outputting a control command to the PLL circuit, the PLL circuit comprising:
   a multi-band control oscillator having a plurality of bands that gradually increases or decreases a frequency in response to a control signal and is separated from each other, the multi-band control oscillator configured to be capable of selectively switching one band among the plurality of bands, and configured to generate a signal of a frequency corresponding to the control signal in the band that is switched as the reference signal;
   a band setting unit configured to set the band of the multi-band control oscillator; and
   a monitor unit configured to monitor the control signal changing in accordance with an input frequency command before the control command generator starts outputting the control command to gradually increase or decrease the frequency from a present start frequency, wherein
   the band setting unit is configured to set the band to be used for a present or subsequent time after the control command generator finishes outputting the control command to gradually increase or decrease the frequency from a previous start frequency to a previous stop frequency and before the control command generator starts outputting the control command to gradually increase or decrease the frequency from the present start frequency, and the monitor unit is configured to monitor a value of the control signal and to compare the value of the control signal with a low threshold of a predetermined plurality of stages and a high threshold of a plurality of stages, and the band setting unit is configured to subtract an offset of a multiple corresponding to a difference between the control signal and the low threshold from information on a previous band when the value of the control signal is smaller than the low threshold to set a band to be used for the present or subsequent time, and is configured to add an offset of a multiple corresponding to a difference between the control signal and the high threshold to the information on the previous band when the value of the control signal is larger than the high threshold to set the band to be used for the present or subsequent time.

6. The PLL circuit according to claim 5, wherein the band setting unit is configured to set the band to be used for the present time.

7. The PLL circuit according to claim 5, wherein the band setting unit is configured to set the band to be used for a next time subsequent to the present time.

8. The PLL circuit according to claim 5, further comprising
a band calibrator configured to calibrate which band the frequency corresponding to the control signal corresponds to in advance based on a comparison result of comparing a phase of a reference clock with a phase of a signal obtained by dividing an output signal of the multi-band control oscillator, wherein
the band setting unit is configured to set the band with reference to the calibration result.

9. The PLL circuit according to claim 1, wherein
the multi-band control oscillator is configured to output the reference signal to the transmitter and the receiver,
the band setting unit is connected to the multi-band control oscillator, the control command generator, and the monitor unit, and
the control command generator is connected to the monitor unit.

10. The PLL circuit according to claim 1, wherein the band setting unit is a band control logic.

11. The PLL circuit according to claim 1, wherein the monitor unit is a level comparator.

12. The PLL circuit according to claim 1, further comprising
a precharge voltage applicator configured to output a control voltage as the control signal to the multi-band control oscillator.

13. The PLL circuit according to claim 5, wherein
the multi-band control oscillator is configured to output the reference signal to the transmitter and the receiver,
the band setting unit is connected to the multi-band control oscillator, the control command generator, and the monitor unit, and
the control command generator is connected to the monitor unit.

14. The PLL circuit according to claim 5, wherein the band setting unit is a band control logic.

15. The PLL circuit according to claim 5, wherein the monitor unit is a level comparator.

16. The PLL circuit according to claim 5, further comprising
a precharge voltage applicator configured to output a control voltage as the control signal to the multi-band control oscillator.

* * * * *